United States Patent
Goudreault et al.

(10) Patent No.: US 11,503,737 B2
(45) Date of Patent: Nov. 15, 2022

(54) MODULAR COMPUTING DEVICE AND FAN ENCLOSURE

(71) Applicant: NATIONAL ENVIRONMENTAL PRODUCTS LTD, Montreal (CA)

(72) Inventors: Alain Goudreault, Ste-Marthe-sur-le-Lac (CA); Claude Goudreault, Delta (CA)

(73) Assignee: NATIONAL ENVIRONMENTAL PRODUCTS LTD, Montreal (CA)

( * ) Notice: Subject to any disclaimer, the term of this patent is extended or adjusted under 35 U.S.C. 154(b) by 50 days.

(21) Appl. No.: 17/217,569

(22) Filed: Mar. 30, 2021

(65) Prior Publication Data

US 2021/0315127 A1    Oct. 7, 2021

Related U.S. Application Data

(63) which is a continuation of application No. 63/004,605, filed on Apr. 3, 2020.

(60) Provisional application No. 63/004,630, filed on Apr. 3, 2020.

(51) Int. Cl.
*H05K 7/20* (2006.01)
*H05K 7/14* (2006.01)

(52) U.S. Cl.
CPC ....... *H05K 7/20136* (2013.01); *H05K 7/1488* (2013.01); *H05K 7/207* (2013.01)

(58) Field of Classification Search
None
See application file for complete search history.

(56) References Cited

U.S. PATENT DOCUMENTS

| | | | |
|---|---|---|---|
| 5,215,834 A * | 6/1993 | Reher | H01M 10/625 429/61 |
| 6,407,533 B1 * | 6/2002 | Bartek | H01M 10/6566 320/150 |
| 6,859,366 B2 | 2/2005 | Fink | |

(Continued)

FOREIGN PATENT DOCUMENTS

| | | |
|---|---|---|
| EP | 2523537 B2 | 11/2012 |
| EP | 3612011 A1 | 2/2020 |

OTHER PUBLICATIONS

EESR/EPO. 21166165.7-1203, Extended European Search Report dated Sep. 14, 2021, The Hague (9 pgs).

*Primary Examiner* — Mukundbhai G Patel
(74) *Attorney, Agent, or Firm* — Crawford Maunu PLLC

(57) ABSTRACT

A modular enclosure for housing various computing devices is provided. The modular enclosure includes a platform and a housing module mounted on the base module. The housing module has lateral sides, a front side, a rear side and a roof defining an interior volume for receiving the various computing devices and fan cassettes. Each fan cassette is provided with its own controller which is configured to adjust the rotational speed of the fan based on the power consumption of the one or more computing devices. When connected in a cluster, the fan cassettes provide a N+1 redundancy, wherein each cassette as an adjacent fan cassette configured as an active backup. The fan cassettes of a cluster communicate via a communication bus. The fan cassettes may include dampers to redirect air drawn from the computing devices back toward them in cold whether conditions, or toward the outdoors, in hot weather conditions.

16 Claims, 26 Drawing Sheets

(56) References Cited

U.S. PATENT DOCUMENTS

| | | |
|---|---|---|
| 8,238,082 B2 | 8/2012 | Salpeter |
| 8,295,035 B2 | 10/2012 | Collier |
| 8,659,895 B1 | 2/2014 | Carlson |
| 8,849,463 B2 | 9/2014 | Hopkins |
| 8,854,809 B2 | 10/2014 | Neumann |
| 9,232,678 B2 | 1/2016 | Bailey |
| 9,326,426 B2 | 4/2016 | James |
| 9,629,285 B1 | 4/2017 | Lachapelle et al. |
| 10,709,034 B2 | 7/2020 | Jochim |
| 10,806,057 B2 | 10/2020 | Wang et al. |
| 2005/0170770 A1 | 8/2005 | Johnson |
| 2008/0092832 A1 | 4/2008 | Bielesch |
| 2014/0359998 A1 | 12/2014 | Zwinkels |
| 2019/0257322 A1 | 8/2019 | Goller et al. |
| 2019/0387646 A1* | 12/2019 | Yang .................. H05K 7/20572 |

\* cited by examiner

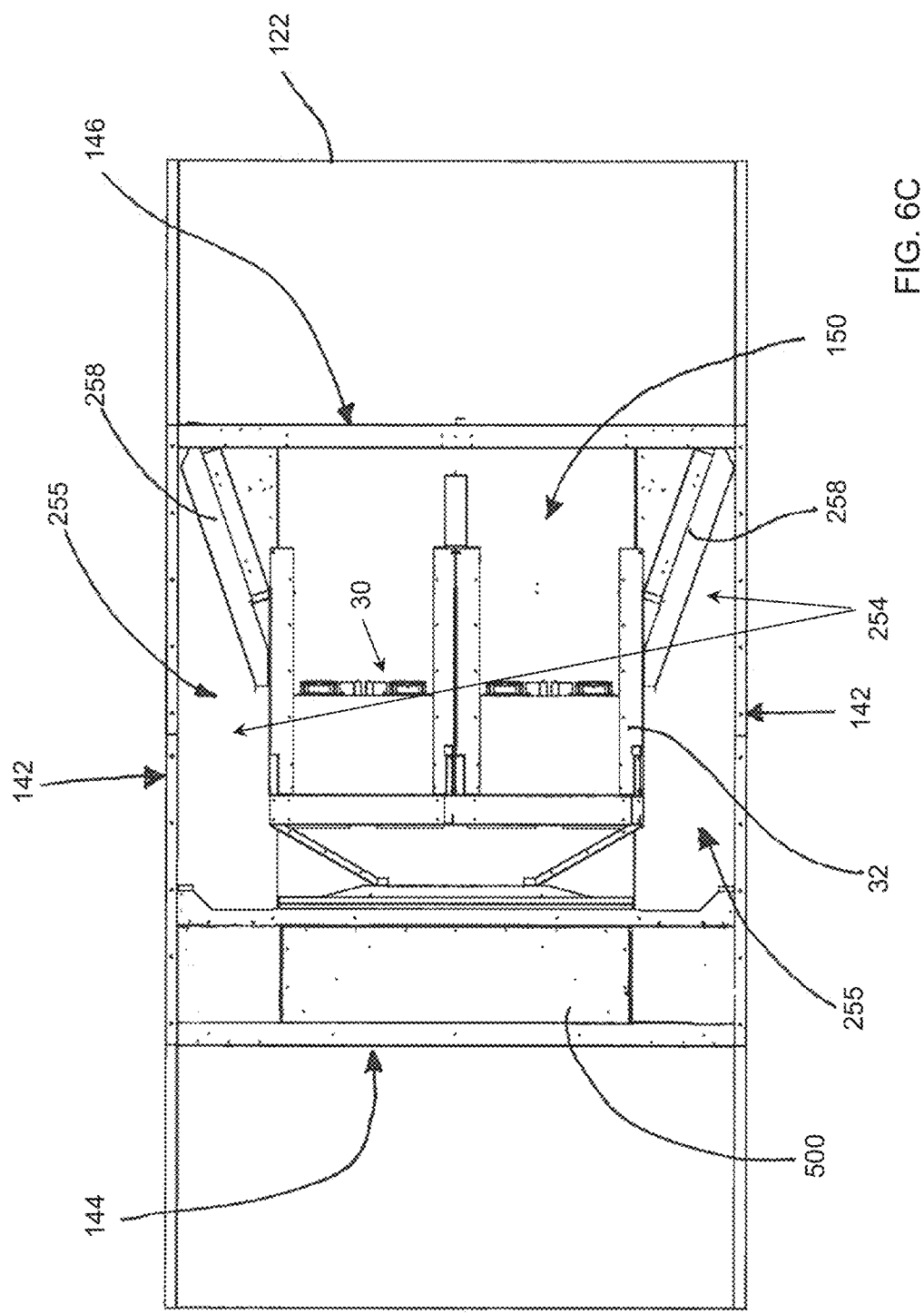

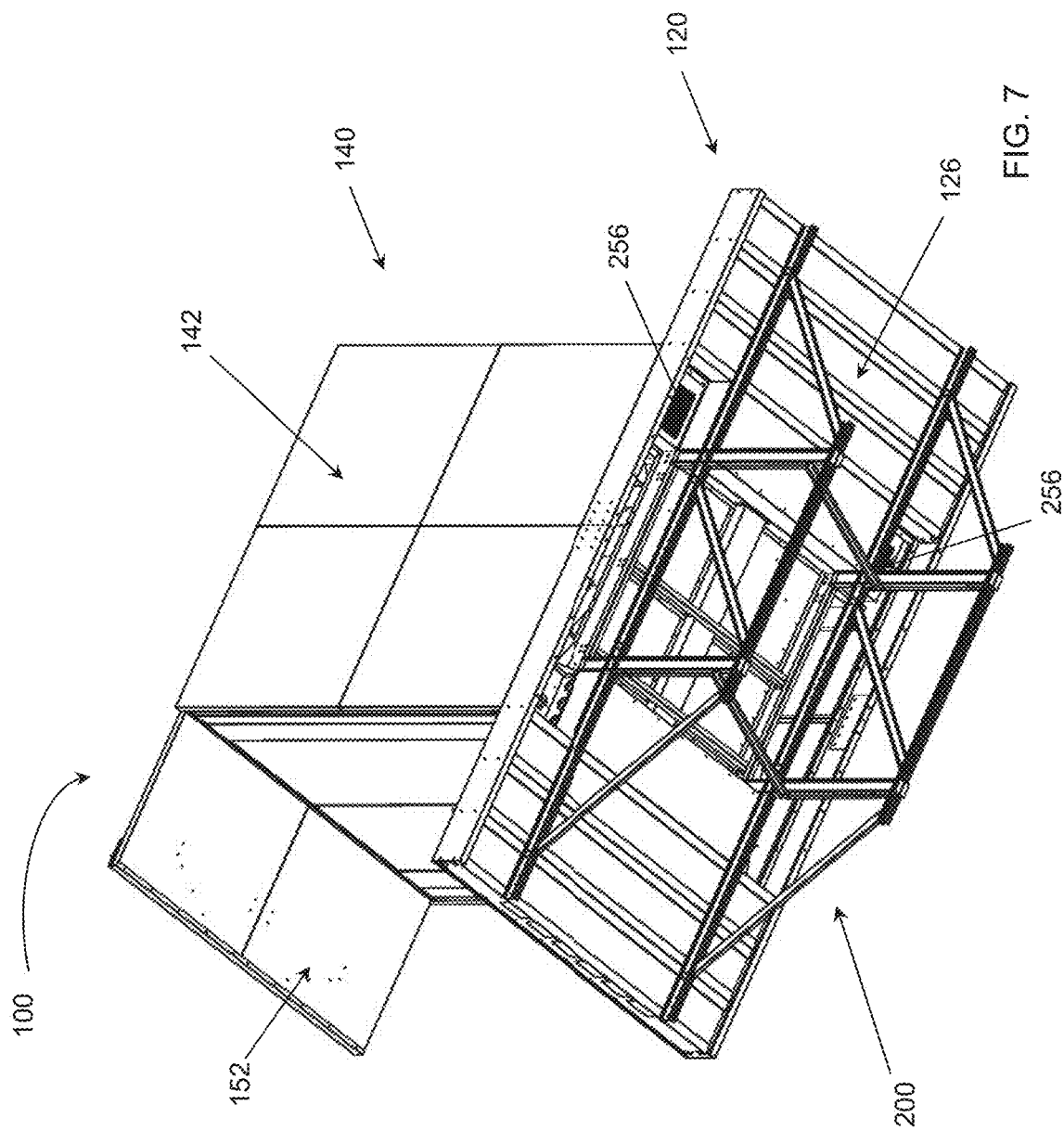

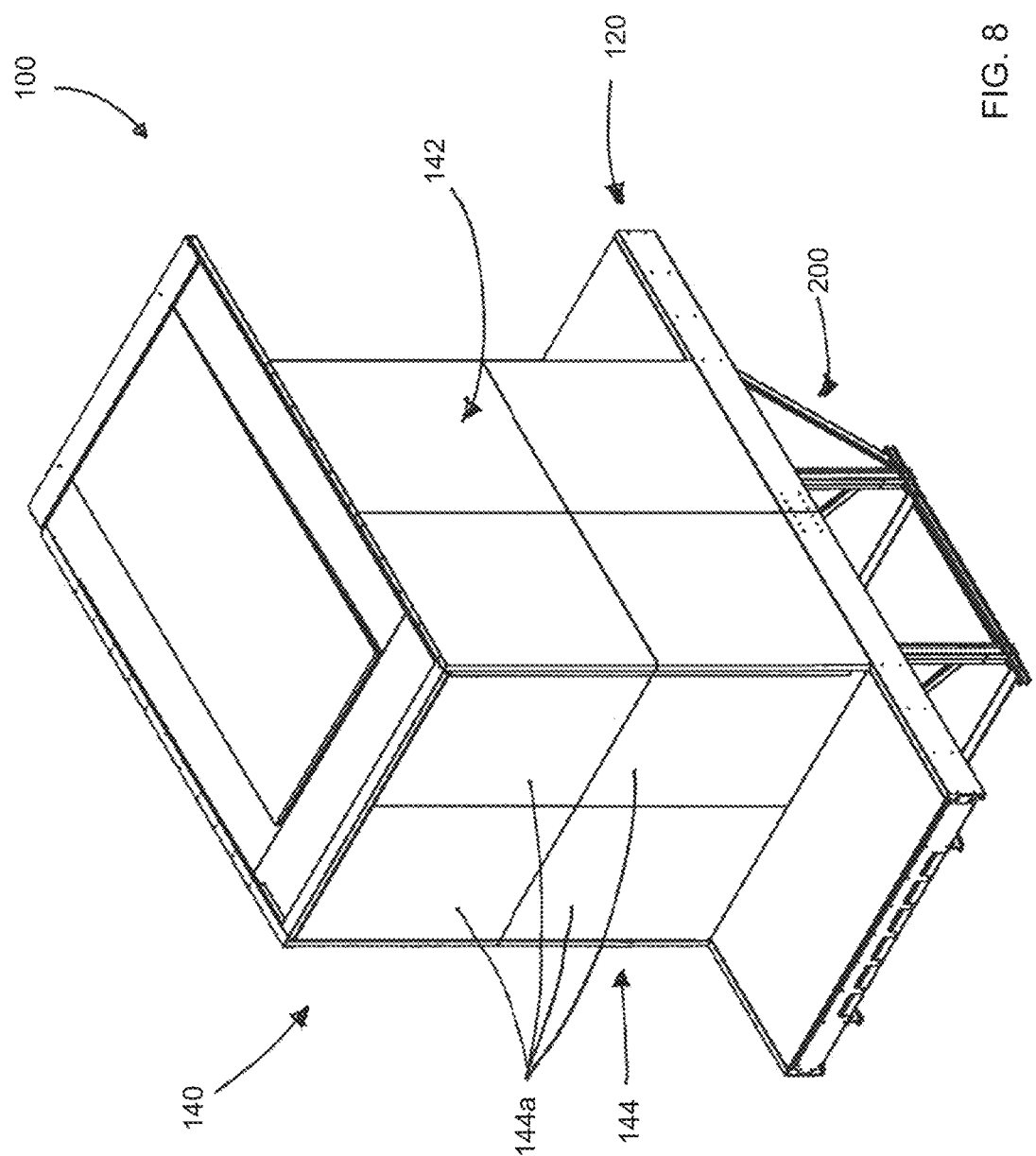

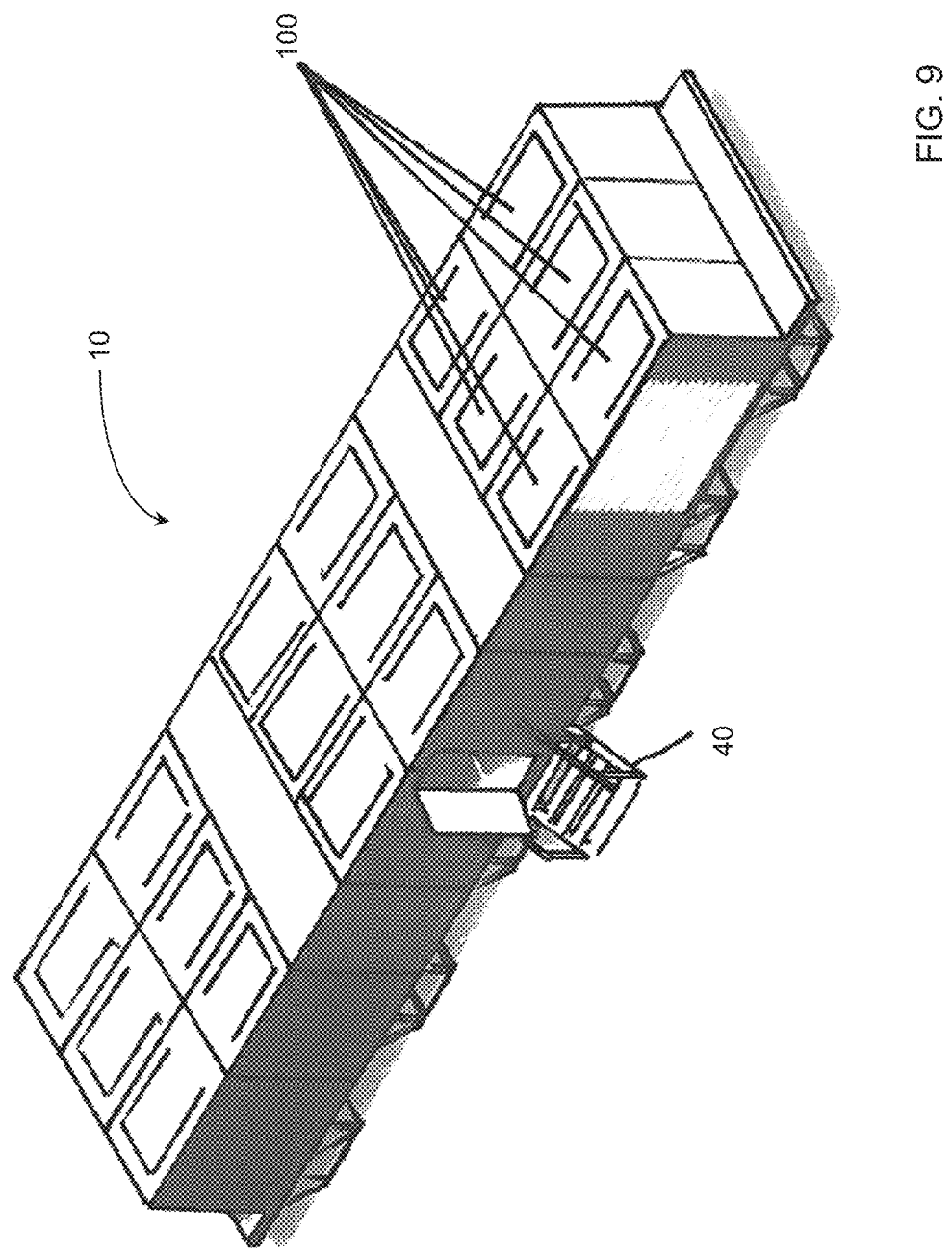

MODULAR COMPUTING DEVICE AND FAN ENCLOSURE

RELATED APPLICATIONS

The present application claims priority to U.S. provisional patent applications Nos. 63/004,605 and 63/004,630, which are incorporated herein in their entirety.

TECHNICAL FIELD

The technical field generally relates to modular enclosures used for housing and ventilating computing devices, and more particularly to an enclosure provided with fan cassettes particularly adapted for conditioning the air surrounding a plurality of computing devices.

BACKGROUND

With the advent of cloud-based computing and remote storing services, the number of data centers and server farms has increased exponentially. Data centers are typically buildings or building sections housing large numbers of computing devices, such as servers, storing devices and/or telecommunication equipment.

Computing devices are energy-intensive and generate a lot of heat. It is essential to properly condition the environment surrounding the processing devices to maintain the ambient temperature within the operational specifications of the computing devices. Data centers are generally built with hot and cold zones, and ventilation systems are used to promote proper air flow between the zones and within the enclosures and/or the buildings which house numerous racks filled with electronic devices and servers.

There is a still room for improvements when it comes to data center enclosures suitable to store large sets of computing devices and provide sufficient ventilation to said devices.

SUMMARY

According to an aspect, a modular computing device and fan enclosure is provided. The enclosure comprises a platform and a housing module mounted on the platform. The housing module has two lateral sides, a rear side, a front side, and a roof, together defining an interior volume for housing computing devices and one or more fan cassettes. The enclosure also comprises a communication bus for relaying an indication of the power consumption of the computing devices. The enclosure also comprises the one or more fan cassette. Each fan cassette comprises a fan comprising a fan inlet for pulling ambient air therein; and a fan outlet for pushing conditioned air thereout; a stator; and a rotor provided with blades for drawing the ambient air from the fan inlet to the fan outlet, and a fan motor for rotating the rotor relative to the stator; a controller operatively connected to the fan motor and to the communication bus, the controller controlling a rotational speed of the fan motor on the basis of the power consumption of the computing devices received via the communication bus; a power supply for powering the fan motor and the controller; and a cassette for housing the fan, the power supply and the controller. Controlling operation of the fan motor based on the power consumption of computing devices provides near real-time control on a temperature inside the housing module.

In possible embodiments, for each of the one or more fan cassette, the controller is configured to increase or decrease the rotational speed of the fan motor proportionally to the power consumption of the computing devices housed in the housing module.

In possible embodiments, the modular enclosure further comprises at least one temperature sensor for sensing a temperature near the one or more computing devices, the controller controlling the rotational speed of the fan motor further based on the temperature sensed by the temperature sensor.

In possible embodiments, each of the one or more fan cassette further comprises: at least one damper provided in the cassette, for directing a flow of air outputted by the fan toward the rear side or the front side of the housing module; a damper actuator, for changing an orientation of the at least one damper. The controller is operatively connected to the temperature sensor and to the damper actuator, for controlling the damper actuator so as to change the orientation of the at least one damper based on the temperature sensed near the one or more computing devices.

In possible embodiments, for each of the one or more fan cassette, the controller is configured to control the damper actuator to position the at least one damper to redirect the air outputted by the fan toward the rear side of the housing module, outside of the housing module, when the temperature sensed near the one or more computing devices is above a predetermined threshold; and to redirect air outputted by the fan toward the front side of the housing module, back to the computing devices, when the temperature is below a predetermined threshold.

In possible embodiments, the enclosure comprises at least three of fan cassettes. The at least three fan cassettes form a fan cassette cluster. The communication bus is operatively connected to respective communication ports of the respective fan cassettes, for communicating thereto the indication of the power consumption of the computing devices; and for communicating thereto an indication of an operational status of the respective fan cassettes of the cluster. The controller of each of the fan cassette is configured to adjust the rotational speed of the rotor further based on the operational status of adjacent ones of the fan cassettes.

In possible embodiments, the controller of any given one of the at least three fan cassettes is configured to operate independently, when no other fan cassette is detected or when the operational statuses of adjacent fan cassette is detected as inactive, and to operate in conjunction with the other fan cassettes of the cluster, when the operational statuses of adjacent fan cassettes is detected as active.

In possible embodiments, the cluster of fan cassettes is configured as a N+1 redundancy cluster, where each fan cassette has one of the adjacent fan cassettes act has as a fan cassette backup. Preferably, the N+1 redundancy cluster is an active-active cluster.

In possible embodiments, the modular enclosure comprises an electrical panel and one or more condition sensors. The condition sensors include at least one of a pressure sensor; additional temperature sensors; a humidity sensor, and current and voltage sensors for determining the power consumption of the computing devices. The controller of each fan cassette is operatively connected to the one or more environmental sensors via the communication bus and is configured to adjust the rotational speed of the corresponding fan further based on readings of the one or more condition sensors.

In possible embodiments, the enclosure comprises a sensor controller operatively connected to the one or more condition sensors, the sensor controller being in communication with each controller of the respective fan cassettes to relay readings of the sensors via the communication bus.

In possible embodiments, the platform and roof are shaped and configured for connecting to similar adjacent modular enclosures so as to form a data center structure, in at least one of a side-to-side and front-to-front configuration. In possible embodiments, the roof comprises a forward section overhanging on the front side of the housing module and the platform comprises a front section extending frontward of the housing module on the front end thereof. The forward section of the roof and the front section of the platform are configured for connecting to a forward section and a front section of a similar adjacent modular enclosure.

In possible embodiments, the platform comprises a rear section extending rearward of the housing module, the rear section being configured for connecting to a rear section of a similar adjacent module in a back-to-back configuration.

In possible embodiments, the modular enclosure further comprises a support assembly connected to the platform, for positioning the base module in an elevated state relative to the ground.

In possible embodiments, the housing module comprises a computing device rack assembly, positioned within the housing module toward the front side, for receiving the computing devices, and a fan cassette rack assembly, positioned within the housing module toward the rear side, the computing device rack assembly and the fan cassette rack assembly being positioned back to back within the housing module.

In possible embodiments, the enclosure comprises at least one plenum section provided with a plenum inlet providing in the platform, said at least one plenum section extending vertically on one of the lateral sides of the housing module, such that surrounding air enters the interior volume from below the housing module though the plenum inlet and travels upwardly within the at least one plenum section, is pulled though the computing device rack assembly toward the rear side of the housing module by the one or more fan cassette.

In possible embodiments, the modular enclosure comprises at least one air filter extending vertically within the housing module, along the at least one plenum section, the surrounding air sucked through the plenum inlet passing through the filter when travelling from the at least one plenum section to the front side of the housing module and toward the rear side of the housing module.

In possible embodiments, the front side of the housing module is provided with a door to allow access to the interior volume, and wherein the at least one air filter comprises two air filters provided on either sides of the door.

According to an aspect, a modular enclosure for housing various computing devices is provided. The modular enclosure includes a base module comprising a platform having a top surface, and a housing module mounted on the base module. The housing module has lateral panels, a back panel and a front panel connected to and extending from the top surface of the platform, and a top panel connected to the lateral, back and front panels opposite the base module. The base module and housing module define an interior volume for receiving the various computing devices. At least one of the top panel and the platform is shaped and sized to allow adjacent modular enclosures to be connected to one another to form a data center structure.

In possible embodiments, the top panel includes a top edge segment extending along at least a portion of a periphery thereof, wherein the top edge segment is adapted to be connected to the top edge segment of an adjacent modular enclosure.

In possible embodiments, the top panel includes a forward section extending towards a front of the modular enclosure and overhanging the lateral panels, wherein the forward section is adapted to be connected to the forward section of an adjacent modular enclosure.

In possible embodiments, the top panel is adapted to be connected to the top panel of an adjacent modular enclosure in a side-to-side or front-to-front configuration. In possible embodiments, the platform of the base module includes a front section extending towards the front of the modular enclosure and being adapted to be connected to the platform of an adjacent modular enclosure in at least one of a front-to-front and side-to-side configuration. Preferably, the front section of the platform is substantially parallel to the forward section of the top panel.

In possible embodiments, the platform of the base module includes a rear section extending opposite the front section towards a back of the enclosure, the rear section being adapted to be connected to the platform of an adjacent modular enclosure in at least one of a side-to-side and back-to-back configuration.

In possible embodiments, the modular enclosure further includes a support assembly connected to at least one of the base module and housing module for positioning the base module in an elevated state.

In possible embodiments, the computing devices include servers loaded in server racks, and wherein the modular enclosure is further adapted to house a ventilation system within the interior volume for conditioning the surroundings of the server racks.

In possible embodiments, the ventilation system includes a plenum configured to establish fluid communication between the interior volume of the housing module and the surrounding environment.

In possible embodiments, the plenum includes at least one plenum section provided with a plenum inlet, and wherein the plenum inlet includes one or more ventilation passages adapted to establish fluid communication between the interior volume and an environment surrounding the modular enclosure. Preferably, the ventilation passages extend through the platform such that surrounding air enters the interior volume from below the housing module.

In possible embodiments, the ventilation system includes one or more fans configured to pull the surrounding air into the interior volume via the ventilation passages to cool the computing devices.

In possible embodiments, the fans are integrated in the back panel and configured to push heated air from within the interior volume therethrough.

In possible embodiments, the ventilation system includes air filters provided within the interior volume proximate the ventilation passages. In possible embodiments, the air filters form part of the plenum. The front panel or front side is preferably provided with a door to allow access to the interior volume, and wherein the air filters are provided on either sides of the door.

In possible embodiments, when multiple modular enclosures are connected to one another, the platforms form a walkway within the data center structure and the top panels form a roof and/or a ceiling of the data center structure.

According to an aspect, a data center structure made of a plurality of modular enclosures as defined above, connected to one another is provided.

According to an aspect, a fan cassette for conditioning or ventilating the surroundings of one or more computing devices is provided. The fan cassette comprises a fan, a dedicated controller, a communication port for communicating with sensors and other similar fan cassettes. The controller is configured (or programmed) to adjust the rotation of the fan based on the power consumed by the one or more computing devices.

In possible embodiments, the fan includes a fan inlet for pulling ambient air therein; and a fan outlet for pushing conditioned air thereout. The fan also includes a stator; and a rotor, typically provided with blades for pulling the ambient air from the fan inlet to the fan outlet. The rotor and blades may also be referred to as an impeller. The fan includes a motor, or rotation means, for rotating the rotor relative to the stator.

In possible embodiments, the controller is operatively connected to the motor of the fan to control its rotational speed, based on the information of the power consumption received via the communication port. The power consumption can be calculated based on readings of the current (in A) and voltage (in V) and/or power (in kW) drawn by the computing devices.

In possible embodiments, the fan and controller are both housed in a cassette or casing, preferably rectangular in shape, but not necessarily. The fan cassette also includes a power supply inlet for powering the fan motor and controller.

In possible embodiments, the fan cassette can include dampers, so as to redirect air expelled by the fan towards the exterior, such as in hot weather conditions, or back toward the computing devices, in cold weather conditions. The fan cassette can be located outside, in a rack or enclosure that is installed outdoors, but it can also be used indoors. When integrated in a rack enclosure located outdoors, the flow of air used to cool the computing devices relies on fresh air intake, entering directly in the rack or enclosure, without the need for any external ducts. However, for indoor applications, an external duct system may be required, depending of the configuration in which the fan cassette is used.

According to another aspect, a fan cassette cluster is provided. The fan cassette cluster comprises at least three fan cassettes as defined above. The fan cassette cluster also requires a communication bus, operatively connected to the respective communication ports of the respective fan cassettes. The bus is configured to communicate the information indicative of the power consumption of the one or more computing devices; as well as the operational statuses of the respective fan cassettes of the cluster. When used as part of the cluster, the controller of each fan cassette can adjust the rotational speed of the rotor not only based on the power consumed of the computing devices it is supposed to cool, but also further based on the operational status of adjacent fan cassettes. Still preferably, the controllers further control the fans' speed based on the outside temperature sensors by one or more sensors, which readings are relayed by the communication bus to the respective controllers.

According to yet another aspect, a fan cassette cluster rack assembly is provided. The assembly includes a rack housing the fan cassettes of a cluster and the communication bus, and preferably: an electrical panel; sensors, such as pressure sensors, humidity sensors, current and voltage sensors, and additional temperature sensors. The rack can also be provided with a communication unit, that communicates with the fan controllers and a remote monitoring device.

BRIEF DESCRIPTION OF THE DRAWINGS

Other features and advantages of the present invention will be better understood upon reading the following non-restrictive description of possible implementations thereof, given for the purpose of exemplification only, with reference to the accompanying drawings in which:

FIG. 6C is a top elevation view of an enclosure with its roof removed, according to an embodiment, showing the configuration of the interior of the enclosure, including plenum sections provided therein.

FIG. 7 is a bottom perspective view of the modular enclosure shown in FIG. 1, showing a plenum inlet provided below the platform to allow airflow within the housing module, according to an embodiment.

FIG. 8 is rear perspective view of a modular enclosure according to an embodiment, showing a plurality of fan cassettes installed in the housing module.

FIG. 9 is a perspective view of a data center structure formed from the connection of a plurality of enclosures, according to another embodiment.

DETAILED DESCRIPTION

Figure 1:
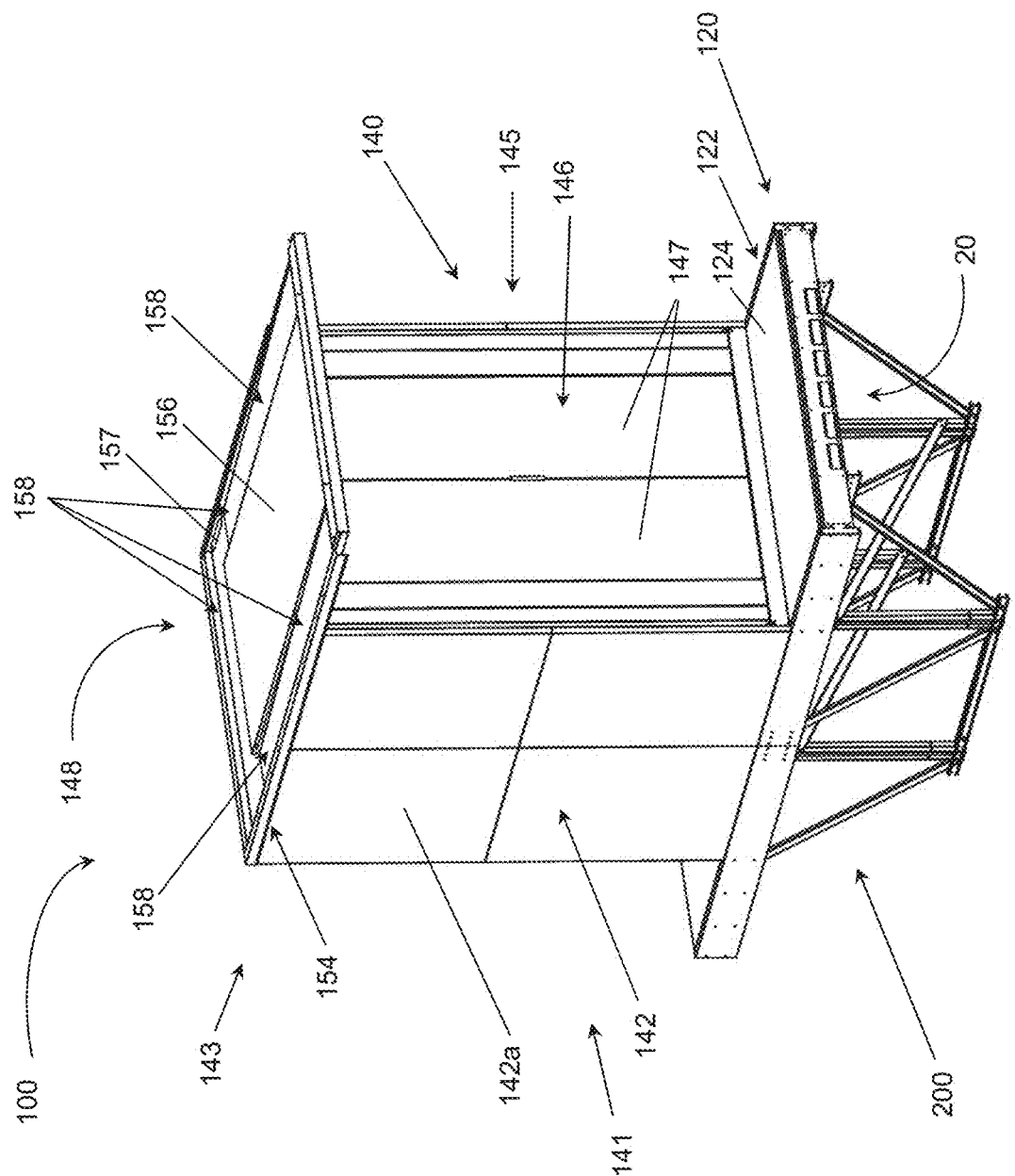
FIG. 1 is a front perspective view of a modular computing device and fan enclosure according to an embodiment, showing a housing module mounted on top of the platform.
Figure 2:
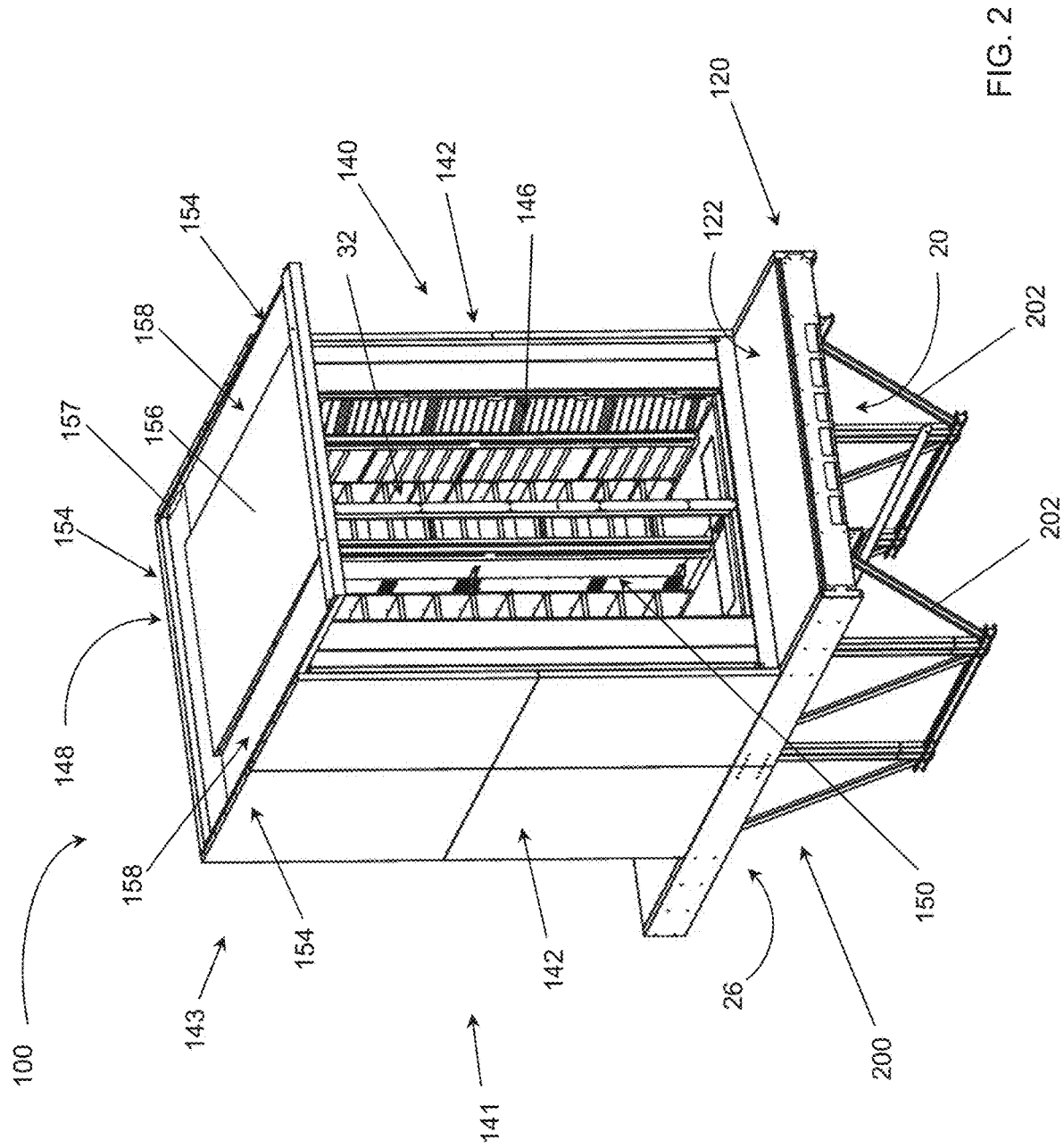
FIG. 2 is a front perspective view of the modular enclosure shown in FIG. 1, showing the interior volume of the housing module, according to an embodiment.

In the following description, the same numerical references refer to similar elements. In addition, for the sake of simplicity and clarity, namely so as to not unduly burden the figures with several references numbers, not all figures contain references to all the components and features, and references to some components and features may be found in only one figure, and components and features of the present disclosure which are illustrated in other figures can be easily inferred therefrom. The embodiments, geometrical configurations, materials mentioned and/or dimensions shown in the figures are optional and are given for exemplification purposes only.

Furthermore, although the various exemplary embodiments described herein may be used in relation with computing devices, such as servers, for example, it is understood that the modular enclosure(s) may be used with other types of devices and/or for other purposes. For this reason, the term "computing device" as used herein should not be taken as to limit the scope of the present disclosure as being used with servers and related components in particular. It should be understood that the term "computing device" should, in the context of the present disclosure, encompass various types of devices with which the described embodiments could be used and may be useful such as computers, databases, servers, NIC (network interface controllers), switches and/or specialized electronic devices.

In addition, although the optional configurations as illustrated in the accompanying drawings comprise various components and although the optional configurations of the modular enclosure as shown may consist of certain configurations as explained and illustrated herein, not all of these components and configurations are essential and thus should not be taken in their restrictive sense, i.e. should not be taken as to limit the scope of the present disclosure. It is to be understood that other suitable components and cooperations thereinbetween, as well as other suitable configurations may be used for the modular enclosure, and corresponding parts, as briefly explained, and as can be easily inferred herefrom, without departing from the scope of the disclosure.

In the present description, and unless stated otherwise, the terms "connected", "coupled" and variants and derivatives thereof refer to any connection or coupling, either direct or indirect, between two or more elements. The connection or coupling between the elements may be mechanical, physical, operational, electrical or a combination thereof. For example, and as will be described further below, components of the data center structure can be connected to one another mechanically via a fastener or linking elements. "Operatively connected" implies that the connection can be direct or indirect, with or without intermediate components therebetween. The connection or link between electronic components can be a physical or wireless connection, when applicable.

As will be explained below in relation to various embodiments, a modular computing device and fan enclosure, or simply "enclosure", configured to form a data center structure when connected to other modular enclosures is provided. Each modular enclosure includes a ventilation system configured for conditioning the computing devices housed therein. The ventilation systems can be further configured to cooperate and condition the air within the formed data center structure. Therefore, the need for a pre-existing structure, room and/or building is no longer required for housing various computing devices. The modular enclosures can be connected to one another to form the structure in which the computing devices are stored.

The term "computing device" encompasses computers, databases, servers, NIC (network interface controllers), switches and/or specialized electronic devices. "Computing devices", also referred to as processing devices, include processing means, such as microcontrollers and/or microprocessors, CPUs or are implemented on FPGAs, as examples only. The processing means are used in combination with storage medium, also referred to as "memory" or "storage means". Storage medium can store instructions, algorithms, rules and/or trading data to be processed. Storage medium encompasses volatile or non-volatile/persistent memory, such as registers, cache, RAM, flash memory, ROM, as examples only. The type of memory is of course chosen according to the desired use, whether it should retain instructions, or temporarily store, retain or update data.

Referring to FIGS. 1 to 4, a possible embodiment of a modular enclosure 100 is shown. The enclosure 100 can include one or more components connected to one another, such as platform 122, which can be part of a base module 120, a housing module 140 and a support assembly 200. As will be described further below, the enclosure 100 includes features and/or components configured to be coupled to adjacent enclosures 100 to form a building structure, such as a data center structure 10 (seen in FIGS. 5, 9, 11 and 12), for example. It is appreciated that the enclosures 100 do not require a pre-existing room, building or other similar structure(s), since the enclosures 100 provide their own standalone structure, either alone or in combination with other enclosures 100. As such, it is appreciated that the enclosures 100, or the formed data center structure, can be installed outdoors, such as in an open field or lot, near a grid substation, on a rooftop of a building, on farmland, at the base of a cell tower, along a rail track, and many more, for example.

In the illustrated embodiment, the base module 120 includes a platform 122 having a top surface 124, and the housing module 140 is adapted to be mounted on the base module 120, and more particularly on the top surface 124 of the platform 122. Furthermore, the housing module 140 has two lateral sides 141, a rear side 143, a front side 145, and a roof 148, together defining an interior volume for housing computing devices and one or more fan cassettes. In possible embodiments, the housing module 140 includes a pair of lateral walls 142 on the lateral sides, a back wall 144 on the rear side, and a front wall 146 on the front side, each panel having a bottom end operatively connected to the platform 122 (e.g., the top surface 124). In some embodiments, each wall of the housing module 140 can be formed of one or more panels. For example, in the illustrated embodiments of FIGS. 1 and 8, the lateral and back walls 142, 144 are formed of four panels which can be connected via any suitable manner, such as via mechanical fasteners (e.g., rivets, nails, screws, etc.) and/or with the use of adhesive. More specifically, the lateral walls 142 include four lateral panels 142a, and the back wall 144 includes four back panels 144a, although other configurations are possible.

Figure 6A:
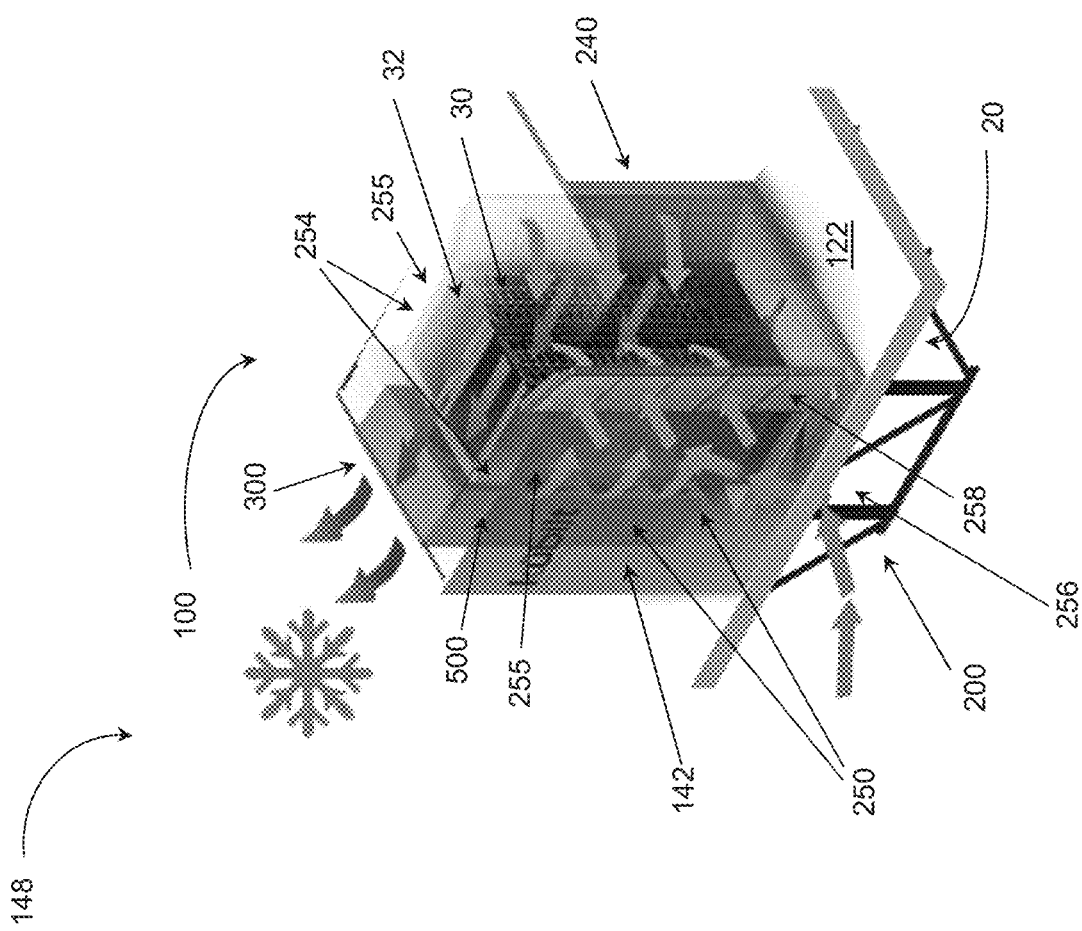
FIGS. 6A and 6B are front perspective views of a modular enclosure, showing the airflow travelling through the enclosure, under the action of the fans, according to possible embodiments.
Figure 6B:
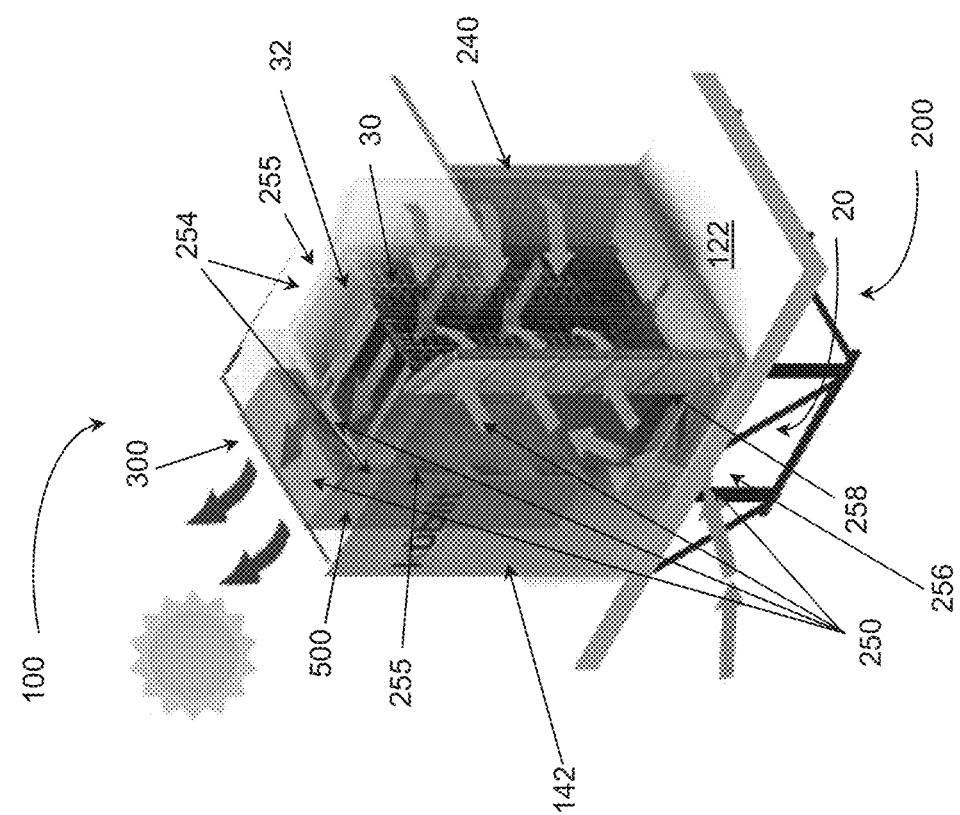

In addition, the housing module 140 includes a roof, or top panel 148, connected to a top end of the lateral, back and front walls 142, 144, 146 for closing the housing module 140 and define, with the platform 122 of the base module 120, an interior volume 150 for receiving (i.e., housing, storing, etc.) various computing devices 30 (identified in FIGS. 6A and 6B). It should thus be understood that, in some embodiments, the housing module 140 can be a shed, or any other similar structure, shaped, sized and configured to enclose/house various items, such as computing devices 30. Similarly, the platform 122 can be provided with sidewalls 123 formed of one or more sidewall panels 123a extending along a length of each side of the platform 122. The sidewall panels 123a can be connected to the platform 122 via any suitable manner, such as mechanical fasteners, for example.

Still referring to FIGS. 1 to 4, the housing module 140 includes a width (W1), a height (H1) and a length (L1) and the base module 120 (e.g., the platform 122) similarly includes a width (W2), a height (or thickness) (H2) and a length (L2). In some embodiments, the width of the housing module 140 (W1) can be between about 48 and 96 inches, for example, but is preferably about 72 inches, and is substantially the same as the width of the platform 122 (W2) such that positioning a pair of enclosures 100 in a side-to-side configuration includes laterally abutting a sidewall of a first platform 122 against a sidewall of a second platform 122 while also abutting a lateral wall 142 of a first housing module 140 against a lateral wall 142 of a second housing module 140. However, it is appreciated that other configurations are possible to position the enclosures 100 side-to-side. For example, the lateral walls 142 located between a pair of enclosures 100 positioned side-by-side can be removed prior to connecting the enclosures together such that the interior volume 150 is effectively doubled. Similarly, the sidewall panels 123a of the platforms 122 can be removed prior to connecting the enclosures 100 together to provide greater clearance for wires and/or cables, for example.

Furthermore, the height of the housing module 140 (H1) can be any suitable height, such as between about 72 and 120 inches, for example, but preferably about 97 inches, allowing computing devices 30 to be housed and/or stored in a convenient and accessible manner, for example. In some embodiments, for example, the housing module 140 can be shaped and sized to host 46U server racks, although other configurations are possible. The platform 122 can have any suitable height (or thickness) (H2), such as about 7 inches, for example, allowing cables and wires, among others, to run through the platform 122 to avoid encumbering the interior and/or surroundings of the enclosure 100. However, it is appreciated that other dimensions are possible. In addition, the platform 122 can be suitably sized/dimensioned to support the weight of the housing module 140 and the computing devices (e.g., without buckling, bending, etc.). In some embodiments, an underside 126 of the platform 122 can be open in order to facilitate access to an internal structure and/or the wires and cables, alternatively, the platform 122 can be provided with a bottom panel.

Figure 3:
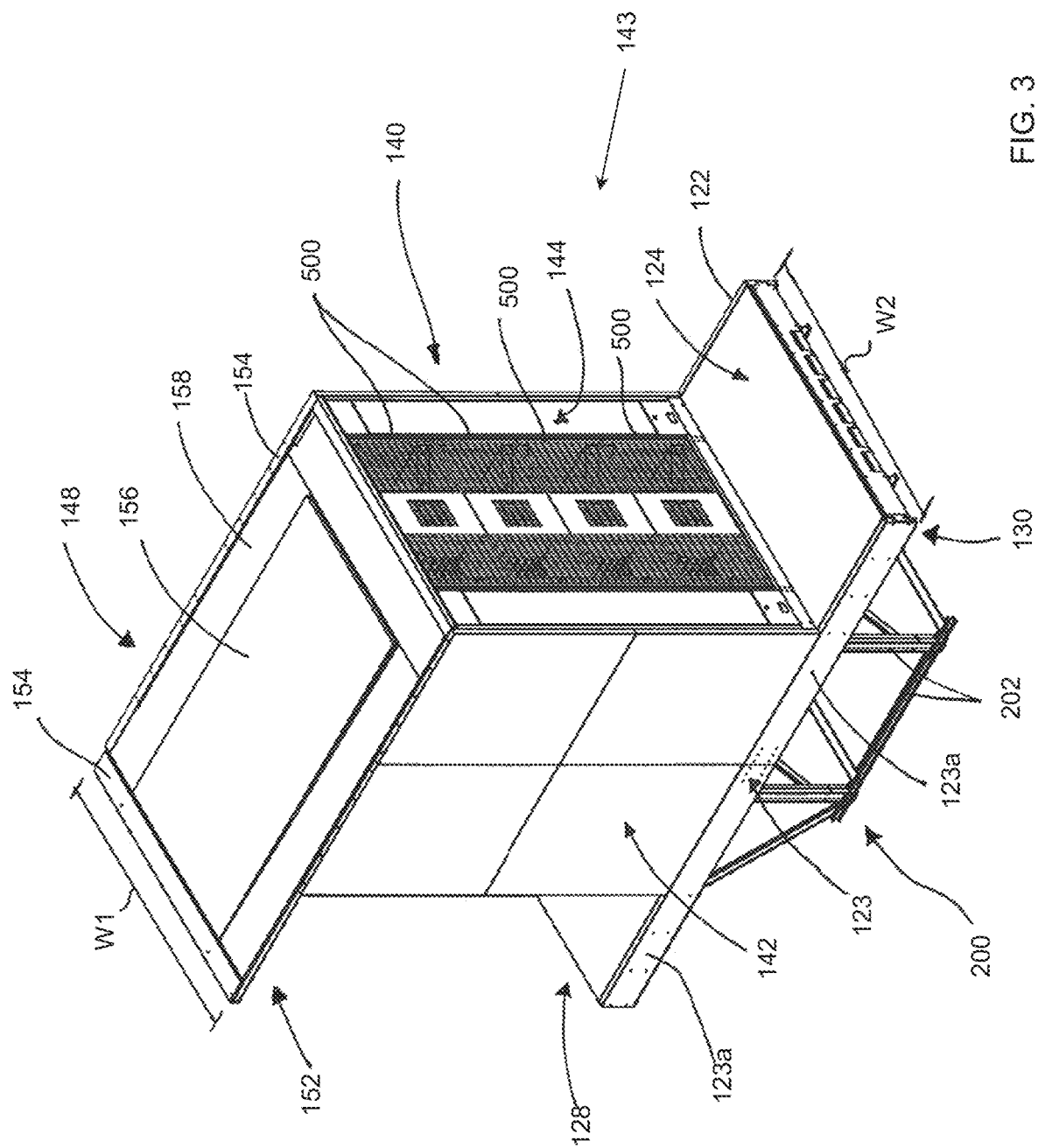
FIG. 3 is a rear perspective view of the modular enclosure shown in FIG. 1, showing a rear portion of a platform extending behind the enclosure, according to an embodiment.
Figure 4:
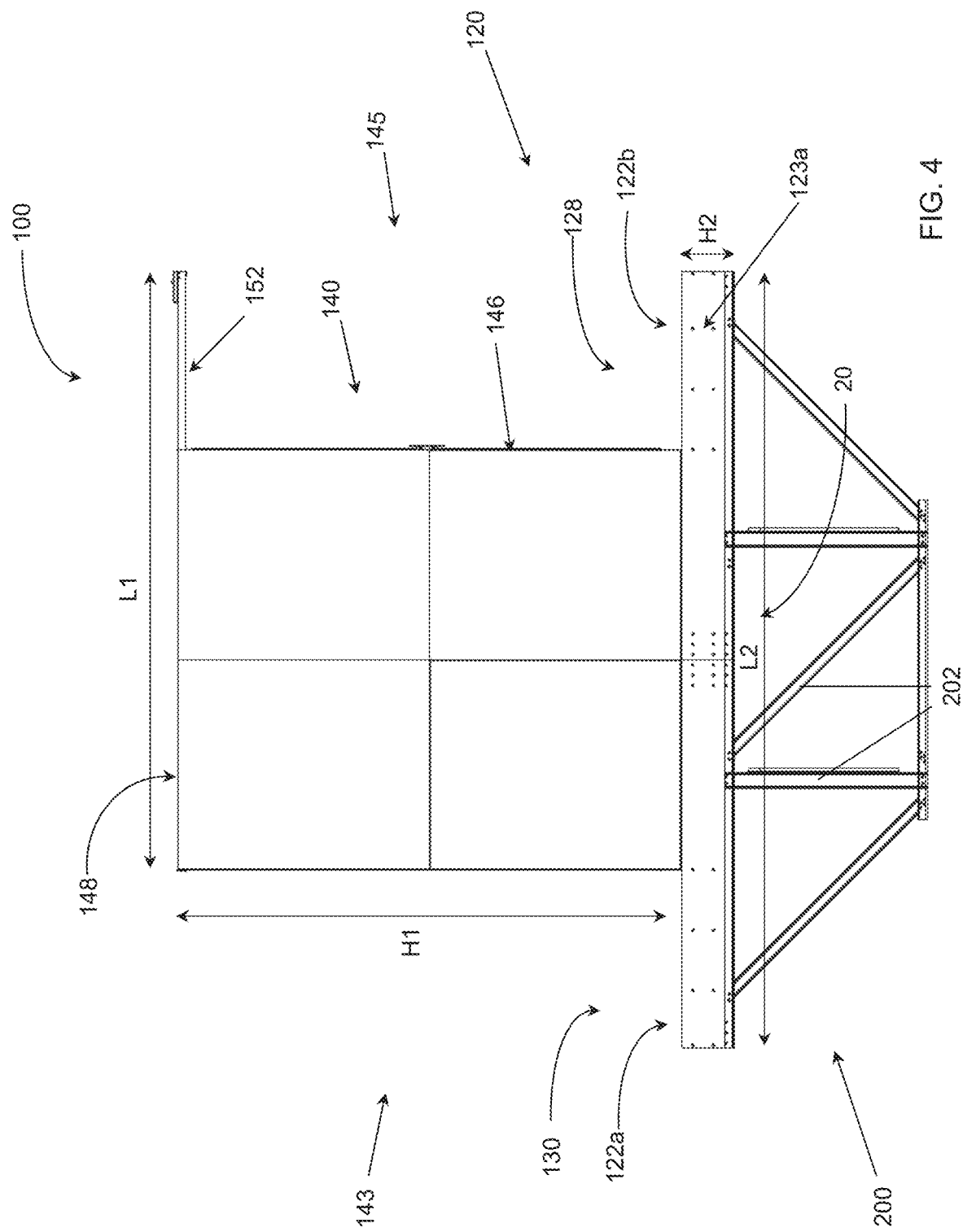
FIG. 4 is a side elevation view of the modular enclosure shown in FIG. 1, showing the roof with a top panel overhanging the housing module, according to an embodiment.

Referring more specifically to FIG. 4, the length (L1) of the housing module 140 can be generally defined by the distance between a rear-most component and a front-most component, or alternatively, be defined by the length of its longest component. In this embodiment, the length (L1) of the housing module 140 is defined by the length of the top panel 148 and is preferably about 116 inches, although it is appreciated that other lengths are possible. As seen in FIGS. 3 and 4, the top panel 148 has a forward section 152 extending towards a front of the enclosure 100 and illustratively overhanging the front panel 146. As will be described further below, the overhanging forward section 152 of the top panel 148 is shaped and configured to be connected to an adjacent enclosure 100, for example to the forward section of the adjacent enclosure when disposed in a front-to-front configuration, such as enclosures 100a and 100b, seen in FIG. 5.

The length (L2) of the platform 122 is defined by the distance between a rear end 122a and a front end 122b of the platform 122 and is preferably greater than the length of the housing module (L1), such as about 150 inches, for example. In this embodiment, the platform 122 supports the housing module 140, and includes a front section 128 extending towards the front of the enclosure 100, and a rear section 130 extending towards a back of the enclosure 100, opposite the front section 128. As illustrated, the front section 128 and rear sections 128, 130 extend further than the housing module 140 in respective directions. As will be described further below, the front section 128 and rear sections 128, 130 of the platform 122 are shaped and configured to be connected to an adjacent enclosure 100, for example to the platform 122 of the adjacent enclosure when disposed in a front-to-front, side-to-side and/or back-to-back configuration.

In some embodiments, the front section 128 of the platform 122 is substantially parallel to the forward section 152 of the top panel 148. Additionally, the front and forward sections 128, 152 extend opposite one another in generally the same direction. Therefore, it is appreciated that a pair of enclosures 100 positioned in a front-to-front configuration can be connected to one another via both the forward sections 152 and the front sections 128 (i.e., via both the platform 122 and the top panel 148). Similarly, the rear section 130 of the platform 122 is substantially parallel to the front section 130 and extends in an opposite direction thereto (i.e., towards the back of the enclosure 100). Therefore, a pair of enclosures 100 positioned in a back-to-back configuration can be connected to one another via their respective rear sections 130 (i.e., via their platforms 122).

Still referring to FIGS. 1 to 4, the enclosure 100 further includes a support assembly 200 provided generally below the base and housing modules 120, 140. The support assembly 200 is adapted to effectively support the base and housing modules 120, 140 and position the same in a raised position. The support assembly 200 preferably has a relatively open support structure in order to allow air circulation below the base module 120. In this embodiment, the support assembly 200 includes structural beams 202 connected to the base module 120 (e.g., connected to the platform 122) on at least two sides thereof for upholding the platform 122 off a ground surface by preferably about 47 inches, for example, although other dimensions are possible, such as between about 36 and 120 inches, for example. It is appreciated that supporting the base and housing modules 120, 140 in an elevated state/position effectively defines an open area 20 below the platform 122 of the base module 120. The open area 20 can be shaped, sized and configured to permit air circulation below the enclosure even in regions where snow can accumulate. The height at which the platform 122 is elevated can alternatively be based on the location where the enclosure is installed. For example, if the enclosure 100 is installed and/or connected to a loading dock, the platform 122 can be raised (via the support assembly 200) to approximately the same height as the loading dock to facilitate connection.

Figure 5:
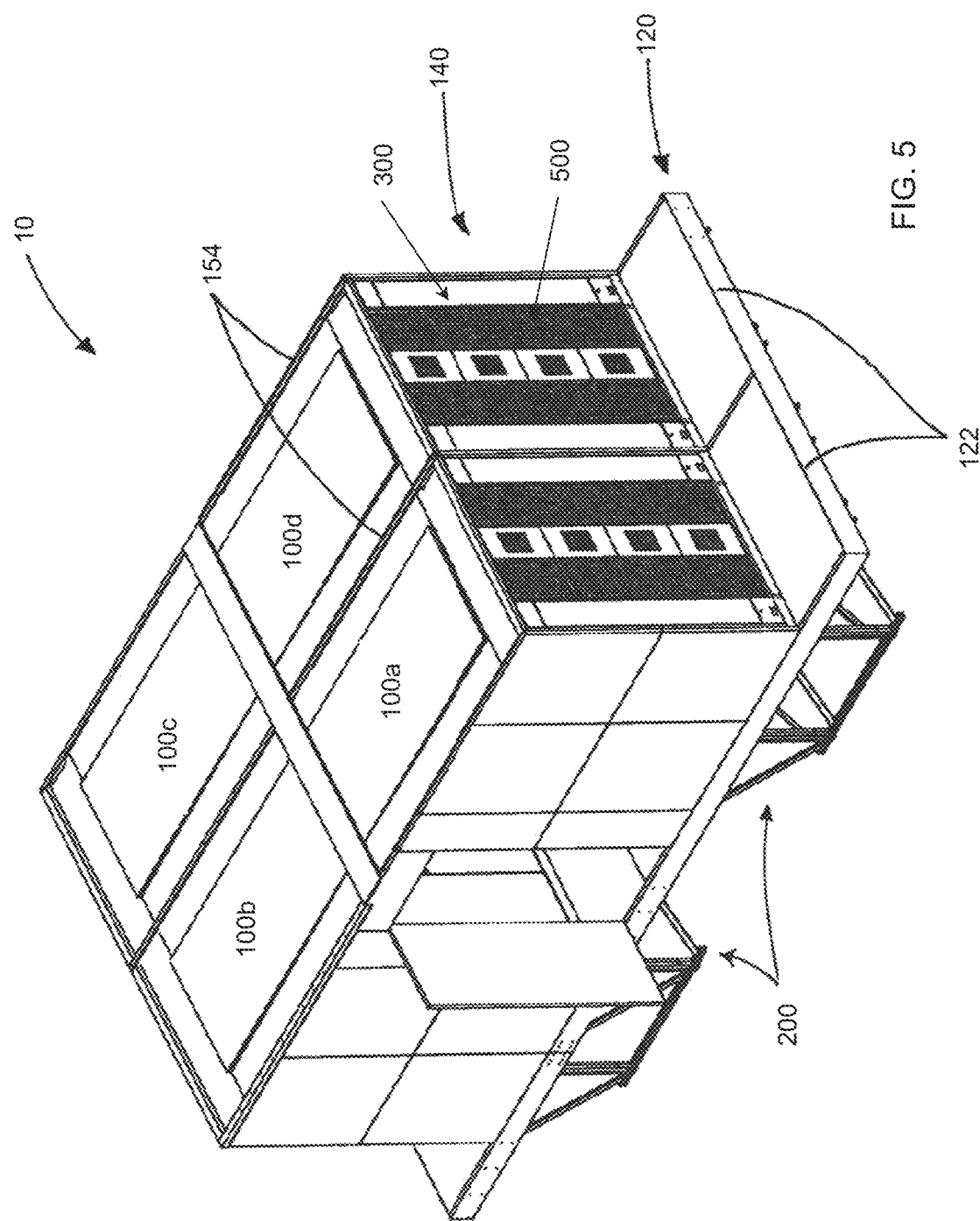
FIG. 5 is a perspective view of a data center structure formed from the connection of a plurality of modular enclosures, according to an embodiment.

In some embodiments, the top panel 148 includes one or more top edge segments 154 extending along at least a portion of a periphery of the top panel 148. More particularly, the one or more top edge segments 154 extend upwardly above the top panel 148 such that the surface of the top panel 148 is lower than a top end of the top edge segments 154. It is appreciated that the top edge segments 154 can be an additional member added to the top panel 148 in order to extend upwardly therefrom, such as a strip or a beam, for example. Alternatively, or additionally, the geometry of the top panel 148 can be configured to define the top edge segments 154. For example, a portion of the top panel 148 can be pressed in order to define a recessed portion along an edge thereof, thus forming a protruding edge segment (i.e., the top edge segments 154). In other embodiments, the lateral walls 142 and/or back wall 144 can be shaped and sized to extend upwardly above the top surface of the top panel 148 such that the top edge segments 154 are formed by a portion of the top end of said panels. As seen in FIG. 5, positioning enclosures 100 in a side-to-side configuration, such as enclosures 100a and 100d for example, effectively abuts the top edge segments 154 of each enclosure against one another. Therefore, a mechanical fastener, such as a clamp (not shown), can be effectively clamped about the contacting/abutting top edge segments 154 in order to connect and/or secure the enclosures 100 together. It is appreciated that other fasteners or fastening methods are possible and may be used to connect two adjacent enclosures 100 together via the top edge segments 154.

The forward section 152 of the top panel 148 can also be provided with a top edge segment 154 extending along a length thereof to allow enclosures 100 positioned in a front-to-front configuration, such as enclosures 100a and 100b, to be connected together using fastener, as described above. Preferably, the top edge segment 154 of the forward section 152 includes an additional strip connected thereto to allow connection between two enclosures. However, it is appreciated that other configurations or fastening methods are possible and may be used. For example, the forward section 152 of a first enclosure 100 can be provided with a male portion of an interlocking device, while the forward section 152 of a second enclosure 100 can be provided with a female portion of the interlocking device. It should thus be understood that engaging the male portion with the female portion can interlock the enclosures 100 together in a front-to-front configuration, thus forming a double-enclosure structure, for example. Preferably, the connection between adjacent enclosures 100 creates a seal in order to have a substantially leak-proof structure.

It is appreciated that the platforms 122 of adjacent enclosures 100 can be connected together via any suitable method, such as those described above in relation to the forward section 152 of the top panel 148. Preferably, the platforms 122 do not have an upwardly protruding edge (such as the top edge segments 154 described above) to allow enclosures 100 to be connected together. However, the front and/or back ends of the platform 122a, 122b can be shaped and configured to allow a fastener, or device (e.g., clamp), to connect two adjacent enclosures 100. For example, the ends of the platform 122 can be at least partially hollow along a length thereof to allow fasteners to be inserted under the platform and extend through the corresponding end and into the adjacent platform 122, therefore securing the platforms together.

As described above, and with reference to FIGS. 1 to 5, the enclosure 100 can be installed outdoors, therefore it can be provided with components and/or features configured to withstand various weather conditions, such as snow and/or rain. For example, the enclosure 100 can be provided with at least one gutter 155 configured to evacuate water and prevent accumulation on the roof (i.e., on the top panel 148). In this embodiment, the enclosure 100 includes two gutters 155 having a gutter inlet 157 provided in the top panel 148, and more specifically in the corners proximate the back panel 144. However, it is appreciated that other configurations are possible. In this embodiment, the gutter inlets 157 are adjacent to the top edge segments 154 such that the aforementioned clamp used to connect two enclosures 100 in a side-to-side configuration can be inserted into the gutter inlets 157. It is appreciated that having the clamp extend into the gutters 155 can further secure the clamp onto the enclosures 100, and thus simultaneously further secures the enclosures 100 together.

In some embodiments, the top panel 148 can have a generally flat and horizontal surface forming a roof of the enclosure 100. However, in other embodiments, the top panel 148 can be slanted/canted in order to route fluids, such as rainwater, towards the rear, and thus towards the gutter inlets 157, for example. Alternatively, and with reference to FIG. 1, the top panel 148 can include a flat portion 156 and one or more slanted portions 158, which can form at least a portion of the gutter 155. In this embodiment, water is routed towards the gutter inlets 157 via the slanted portion 158, and, while the flat portion 156 can facilitate installation of other components and/or structures atop the top panel 148 (e.g., antennas, solar panels, etc.).

Now referring to FIGS. 6A to 7, in addition to FIGS. 1 to 5, the enclosure 100 can further include a ventilation system 250 configured to condition (e.g., cool) the computing devices 30 within the housing module 140. The ventilation system 250 can include at least one fan 500 cassette installed proximate the back panel 144 and being configured to provide cold air to the computing devices, while evacuating hot or heated air from within the interior volume into the surrounding environment. In this embodiment, the ventilation system 250 includes a cluster 300 of fan cassettes 500, such as four (4) fan cassettes 500, forming a vertical stack provided at the rear of the housing module 140. As seen in FIG. 3, the cluster of fan cassettes can be integrated in the back panel 144 and are especially adapted to condition the surroundings of the computing devices 30, such as servers loaded in one or more server racks 32 (FIGS. 6A to 6C), for example. Ambient air is drawn from the front side of the servers, toward the back of the server rack, as it is pulled by the fans 540 of the fan cassettes 500, towards the exterior or redirected back towards the front.

More specifically, the rear side of the fan cassette 500 typically faces the computing devices, while the front side is exposed at the back of the housing module 140 and is accessible for maintenance. Depending on the temperature of the computing devices' surroundings, i.e. outside temperature, the heated air exiting the computing devices 30 can either be redirected back to the computing devices 30, as illustrated by the arrows seen in FIG. 6B (i.e., when the surrounding temperature is cold) or away therefrom, as illustrated by the arrows seen in FIG. 6A (i.e., when the surrounding temperature is hot). As seen in FIGS. 6A and 6B, when hot air is expelled away from the computing devices, it will be pulled through the fan cassettes 500.

The ventilation system 250 can include a plenum 254 defined within the housing module 140 to facilitate air intake within the housing module 140 for conditioning the computing devices housed therein. In this embodiment, the plenum 254 includes at least two plenum sections 255 provided within the interior volume 150, on either sides thereof (i.e., proximate the lateral walls 142). The plenum sections 255 can be configured to allow air circulation within the interior volume, thus allowing cold air to enter the housing module 140. Each plenum section 255 is provided with one or more plenum inlets 256 configured to establish fluid communication between the interior volume 150 and the surrounding environment. In this embodiment, the plenum inlets 256 include an aperture, or passage, extending through the thickness of the platform 122 to allow air to flow into the interior volume from below (i.e., from the open area 20 defined by the support assembly 200). The flow of air used to cool the computing devices thus relies on fresh air intake, entering directly in the enclosure, without the need for a complex system of ducts and conduits.

It is appreciated that connecting two enclosures 100 side-by-side, and removing the lateral walls (identified with reference numeral 142 on FIG. 3) and sidewall panels (identified with reference numeral 123a on FIG. 3) between the enclosures, as described above, effectively positions the plenum sections 255 (best shown in FIG. 6c) of each enclosure side-by-side. As such, the cross-sectional area of the plenum section 255 formed in the center of the created structure is generally doubled, when compared to the plenum section 255 of a single enclosure 100. Similarly, the plenum inlets 256 can be combined to form a larger inlet, although other configurations are possible. It should thus be understood that the plenum section 255 located between a pair of enclosures 100 connected side-by-side can be configured to provide airflow to the computing devices housed of each enclosure. Furthermore, a generally colder area, such as a cold aisle, can be defined beneath the base and housing modules 120, 140 due to their elevated position provided by the support assembly 200. As such, it should be understood that relatively cooled air enters the interior volume of the enclosures 100 via the plenum inlets 256 provided below the platforms 122.

In the illustrated embodiments, the computing devices are loaded in one or more server racks 32 disposed within the interior volume 150. In this embodiment, the housing module 140 effectively houses a pair of server racks installed side-to-side. The outer surfaces of the server racks 32 can be shaped and configured to form a side of each plenum section 255 such that airflow entering the interior volume via the plenum 254 flows directly along a side of the server racks 32. Furthermore, in some embodiments, the ventilation system 250 includes filters 258 configured to effectively filter the air and prevent debris from entering the interior volume 150 and potentially damaging the computing devices. As seen in FIGS. 6A to 6C, the air filters 258 can be positioned proximate the plenum inlets 256 and extend upwardly along the server racks 32 to filter the air as it enters the interior volume 150 via the plenum 254. The filters 258 can form a side of the plenum sections 255, similar to the server rack frames, to substantially close off the plenum sections 255. Additionally, the filters 258 are preferably installed at an angle, which can more efficiently filters the air flowing into the interior volume 150. However, it is appreciated that other configurations are possible, such as positioning the air filters within the platform 122 along the passage of the plenum inlets 256, for example.

Referring broadly to FIGS. 1 to 12, in some embodiments, the data center structure 10 can be in several different formats, such as a single format, i.e., formed from a single modular enclosure (FIGS. 1 and 10), a double format, i.e., formed from a pair of modular enclosures 100 (e.g., enclosures 100a and 100b, or 100a and 100d seen in FIG. 5), an extending format, i.e., formed from four or more modular enclosures 100 (FIGS. 5, 9, 11 and 12) or any other suitable number of modular enclosures 100. In preferred embodiments, the structure 10 is formed from an even number of enclosures 100, although other configurations are possible. It is therefore appreciated that the enclosure 100 can be used to form a scalable and modular data center structure. An access door can be provided to each individual enclosure 100 and/or to the formed data center structure 10, depending on the chosen format.

Figure 10:
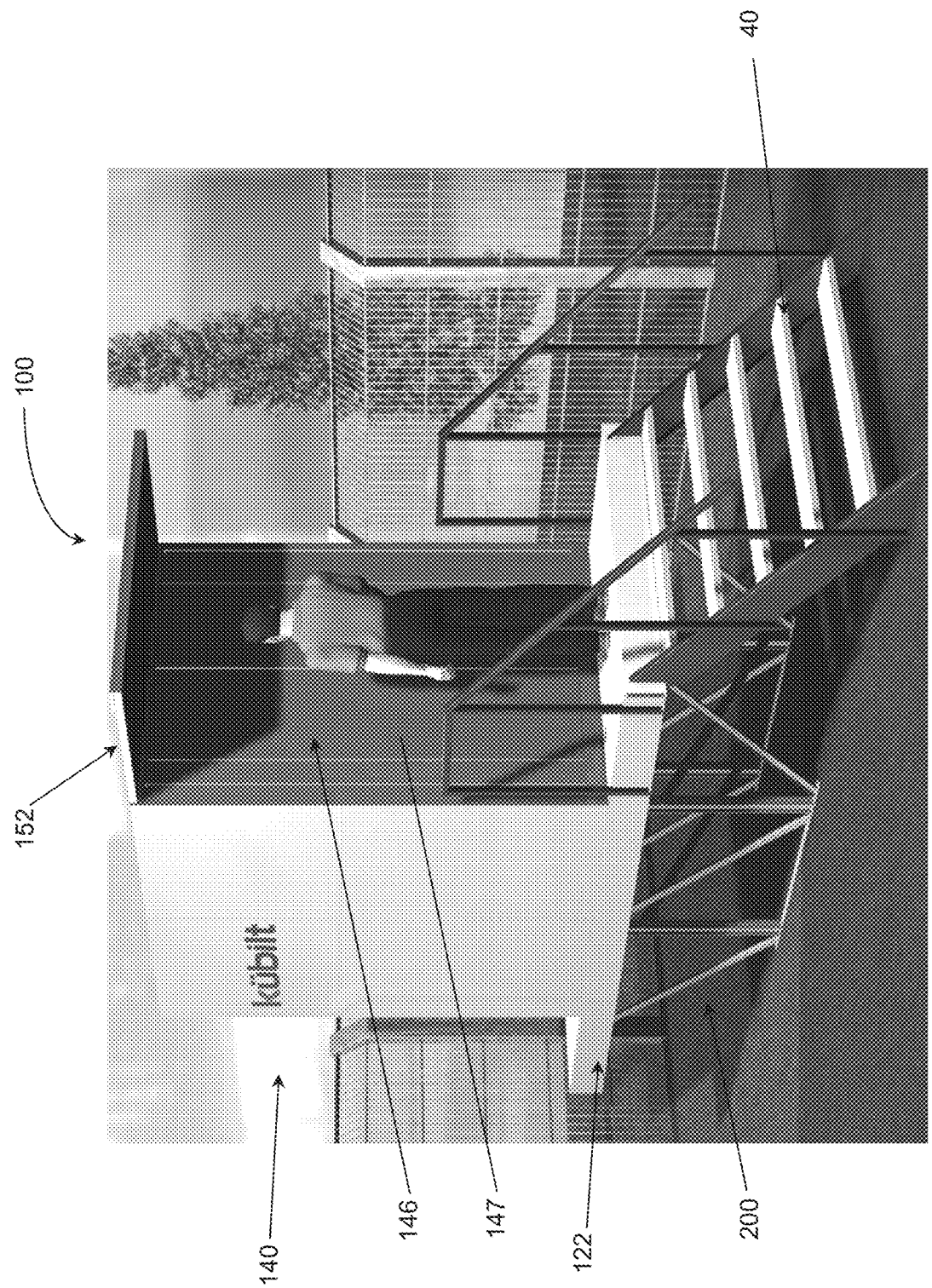
FIG. 10 is a front perspective view of a modular enclosure according to an embodiment, showing an access door and stair assembly.
Figure 11:
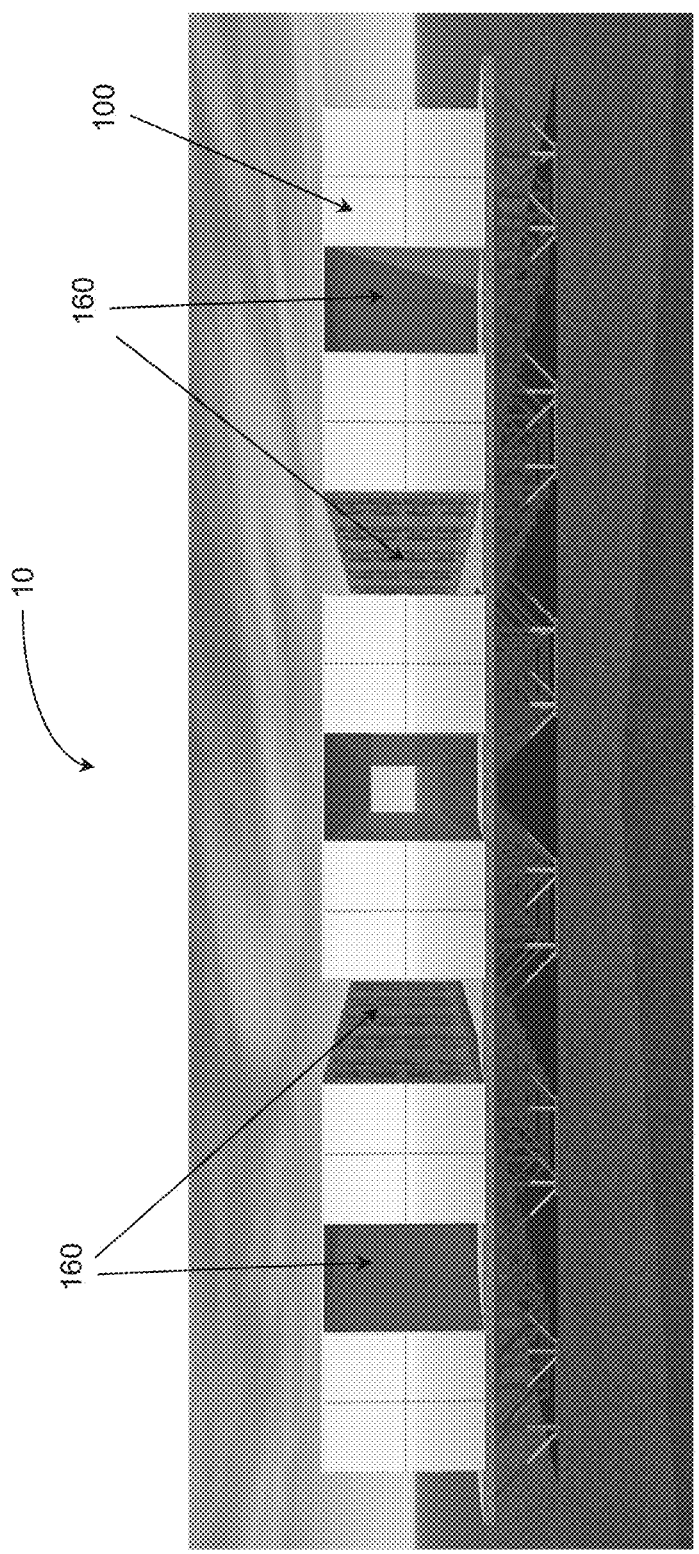
FIG. 11 is a front view of a data center structure formed from the connection of a plurality of enclosures, according to an embodiment, showing service corridors formed between some of the enclosures.

As seen in FIG. 10, a singular enclosure 100 can be provided with an access door 147 as part of the front panel 146 of the housing module 140. The access door 147 can be provided with additional security features, such as a lock, for example. In addition, a stair assembly 40 can be provided to facilitate access to the housing module 140 since it is positioned on the raised platform 122 (i.e., raised by the support assembly 200). Furthermore, as seen in FIGS. 5, 10 and 11, it is appreciated that the floors, or walkways, of the structure 10 are defined by the platforms 122 of each enclosure 100 connected to one another. Similarly, the roof/ceiling of the structure 10 is formed by the top panels 148 of each enclosure 100 connected to one another.

Figure 12:
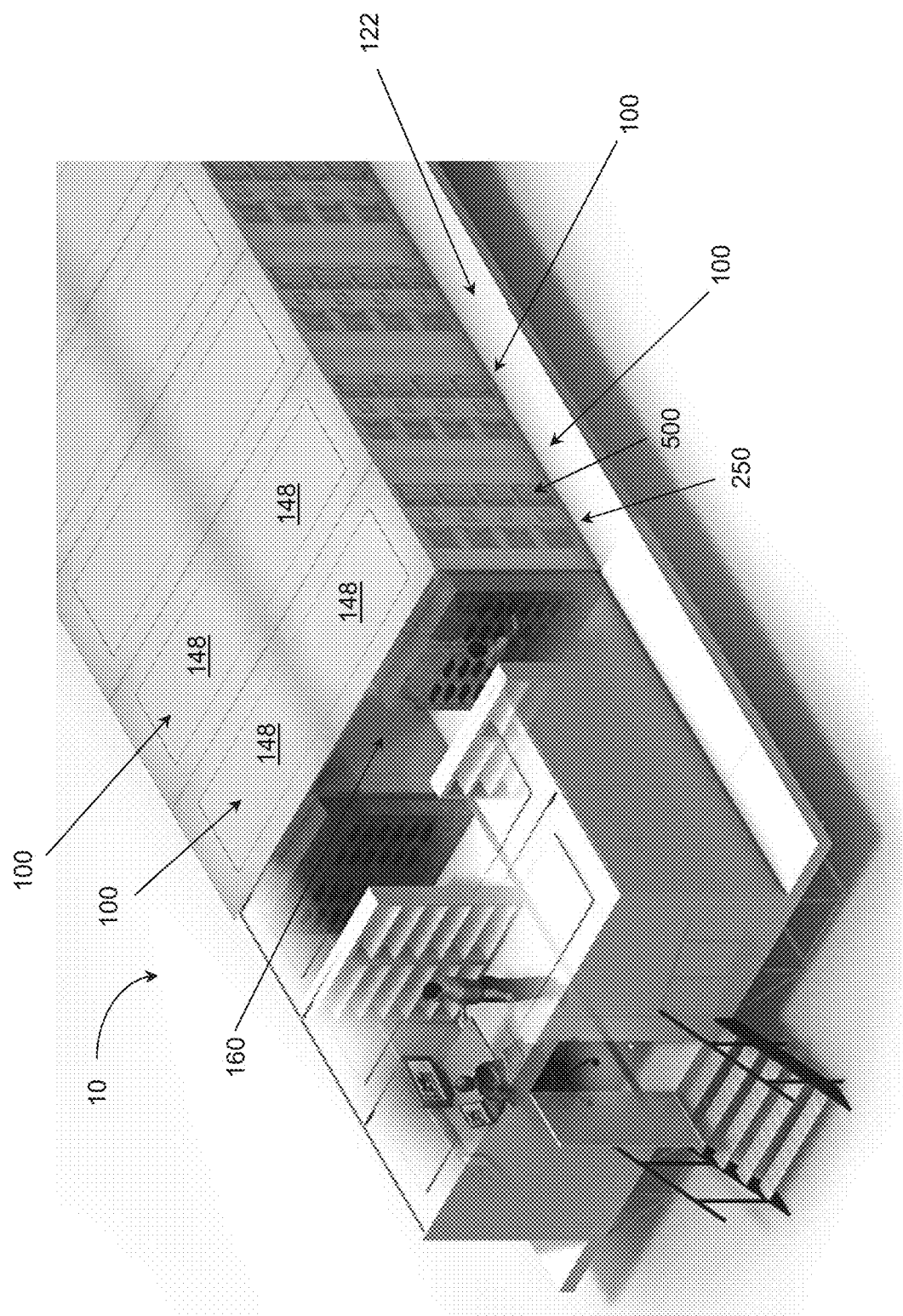
FIG. 12 is a perspective view of a data center structure formed from the connection of a plurality of enclosures, according to an embodiment, showing an office space formed from enclosures and connected to enclosures housing electronics.
Figure 13:
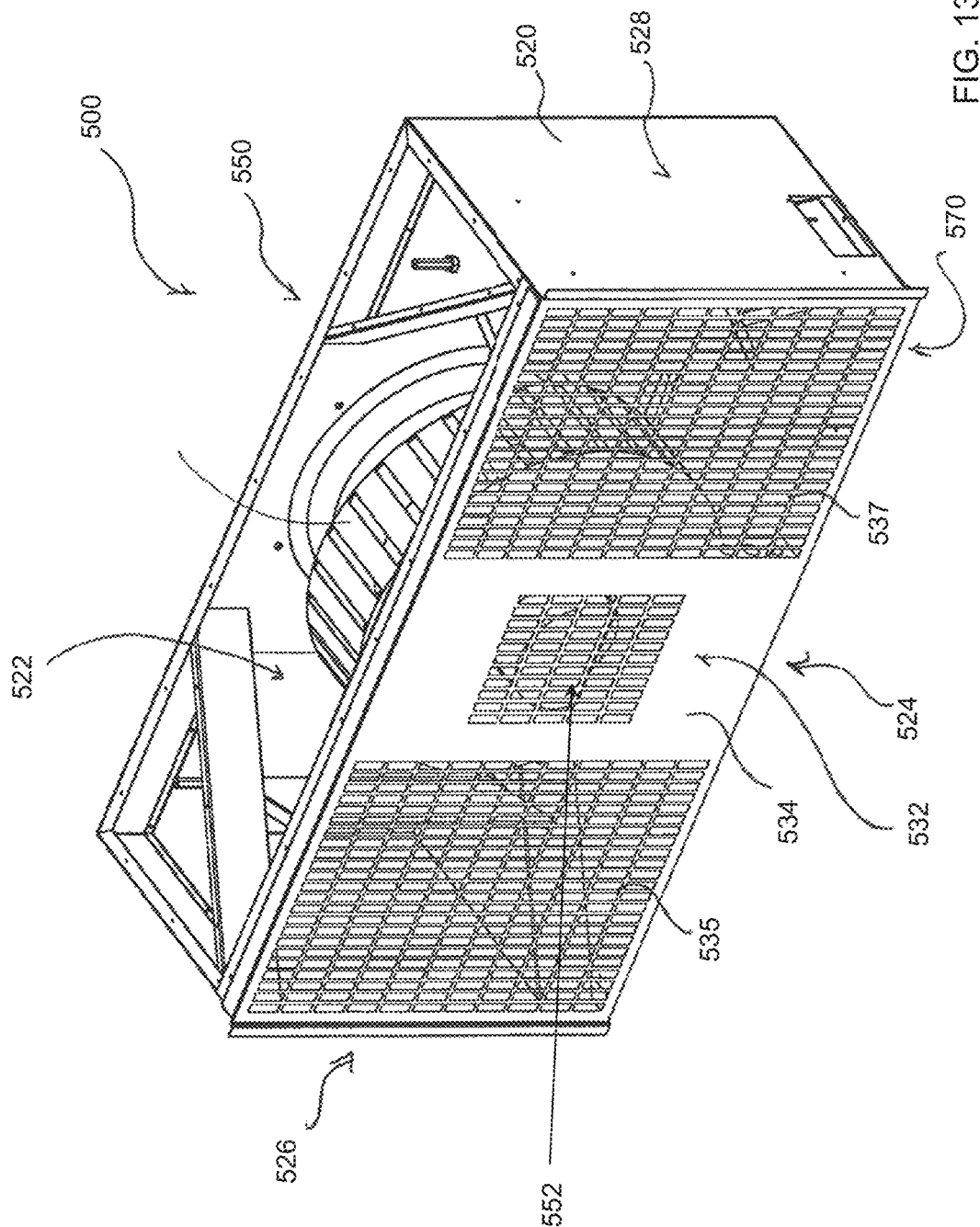
FIG. 13 is a front perspective view of a fan cassette according to a possible embodiment, with the top plate removed to better show some of the components therein.

As best seen in FIGS. 9, 11 and 12, the walkways, or service corridors 160, are typically formed along the front and/or the back of each enclosures 100. Each corridor can be provided with a roof, as seen in FIG. 9, although it is appreciated that the corridors formed at the back of the enclosures 100 can be left open, as seen in FIG. 11, to promote the evacuation of warmer air via the ventilation system. In contrast with existing data center buildings, a cold zone or area is located underneath the module enclosures 100, and may also be located all around the walls of the enclosure which are exposed outdoors.

In some embodiments, the data center structure 10 can be provided with enclosures 100 which do not contain computing devices. These enclosures 100 can be connected together, as described above, to form rooms or open areas within the structure, such as next to the server racks in adjacent enclosures 100. For example, and as seen in FIG. 12, an office space can be defined at an entrance of a building structure 10, which connects to additional enclosures 100 provided with computing devices. It should be understood that the enclosures 100 can be configured and connected in any suitable configurations to create structures of various different shapes, sizes and uses.

Figure 18:
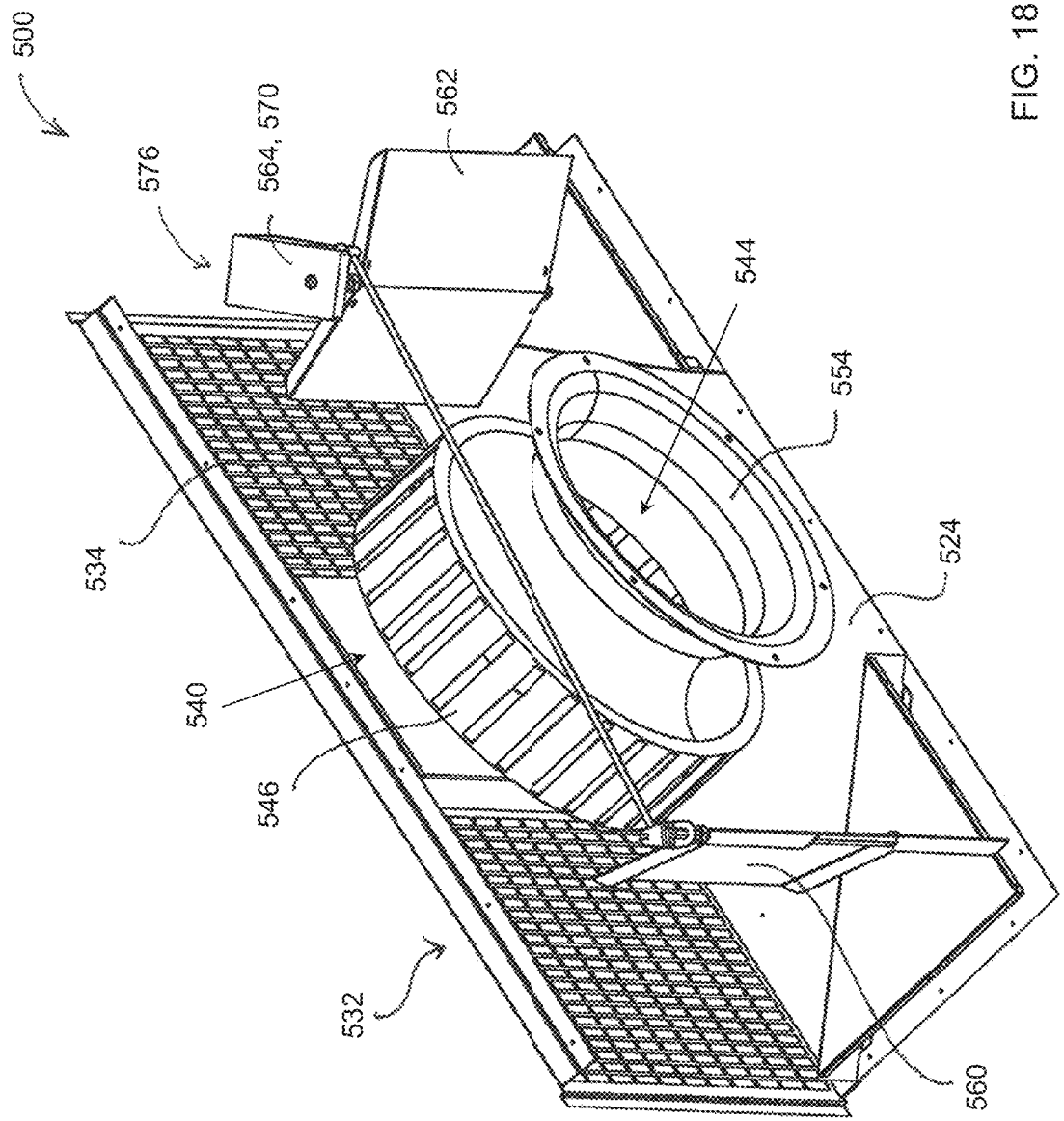
FIG. 18 is another bottom perspective view, with the bottom and side panels removed, showing the fan inlet cone and the dampers.
Figure 19:
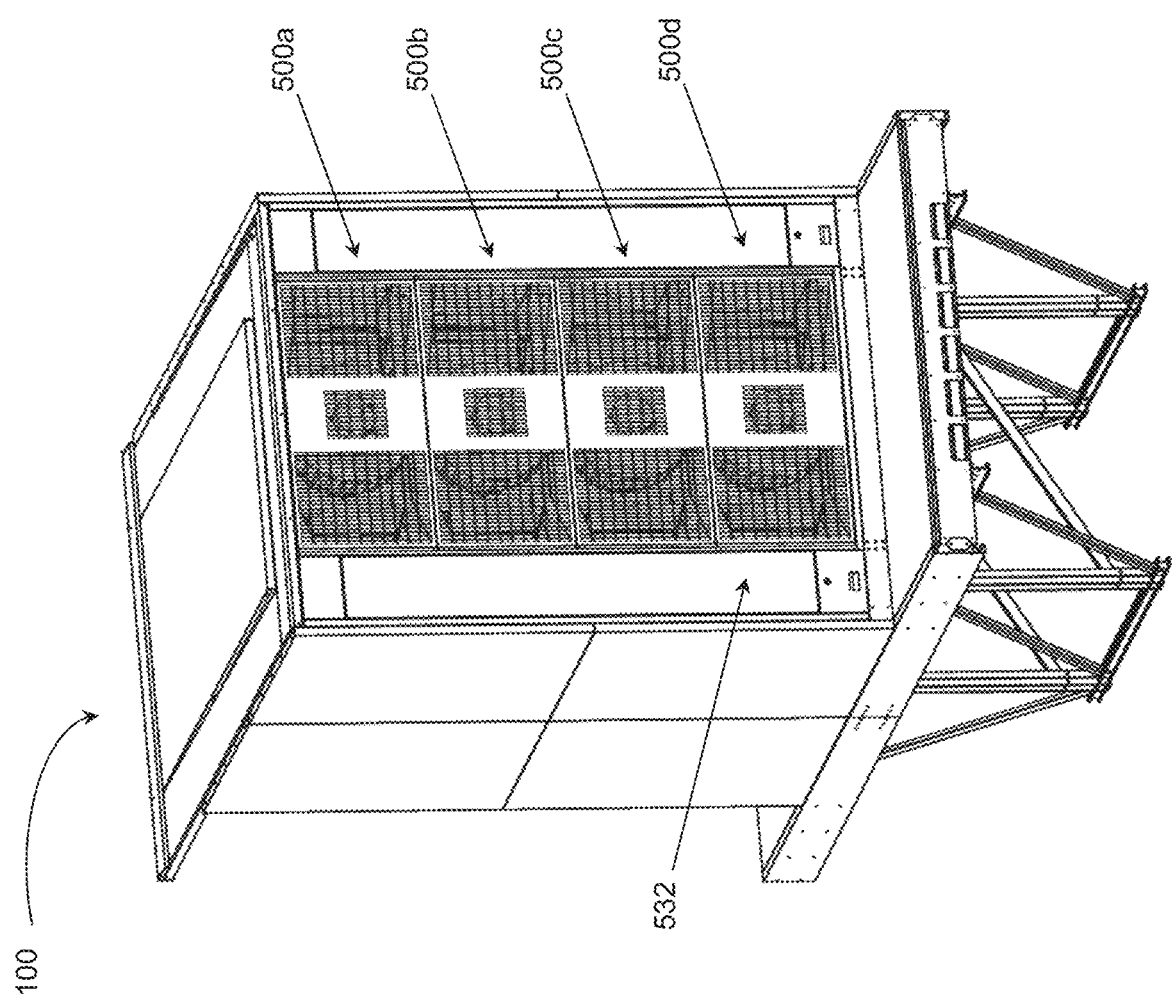
FIG. 19 is a perspective view showing the fan side of a combined computing and fan enclosure, according to a possible embodiment.
Figure 20:
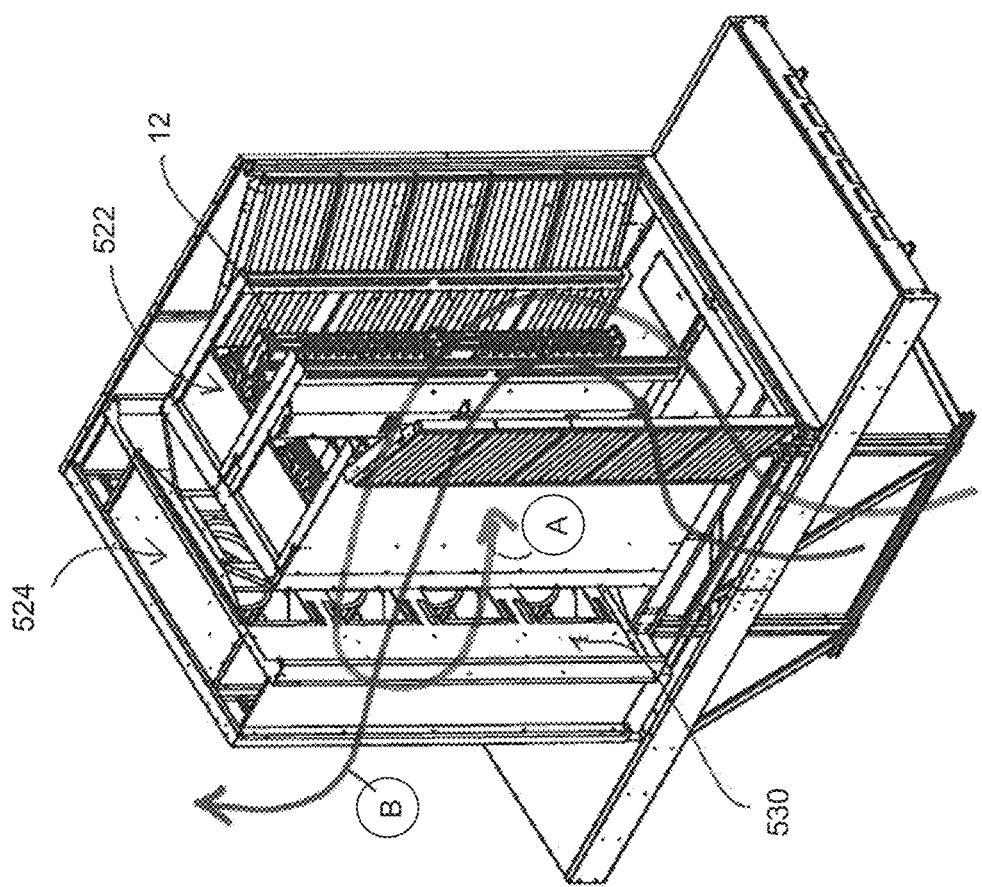
FIG. 20 is a perspective view showing the computing device side of the enclosure of FIG. 19, with the lateral walls and roof removed.

Referring to FIGS. 13 to 20, the proposed fan cassette 500 and cluster allows simplifying the initial installation, configuration, update and upgrades of the ventilation components required for managing the complex environment of data centers or server farms. In operation, the fan cassette 500 can be used alone, but is preferably used in combination with other similar fan cassettes 500, thus forming a cluster. As best shown in FIG. 20, the fan cassettes 500 are especially adapted to condition the surroundings of several computing devices, at the back of a server rack for example.

Ambient air is drawn from the front side of the servers, toward the back of the server rack, as it is pulled by the fans of the cassettes, towards the exterior, if the computing devices must be cooled, or redirected back to the front side of the servers, such as when the outside temperature is too cold. Air can also be pulled from the front side of the servers toward the back of the racks by server fans, as well as by the fan cassette(s) 500.

Figure 14:
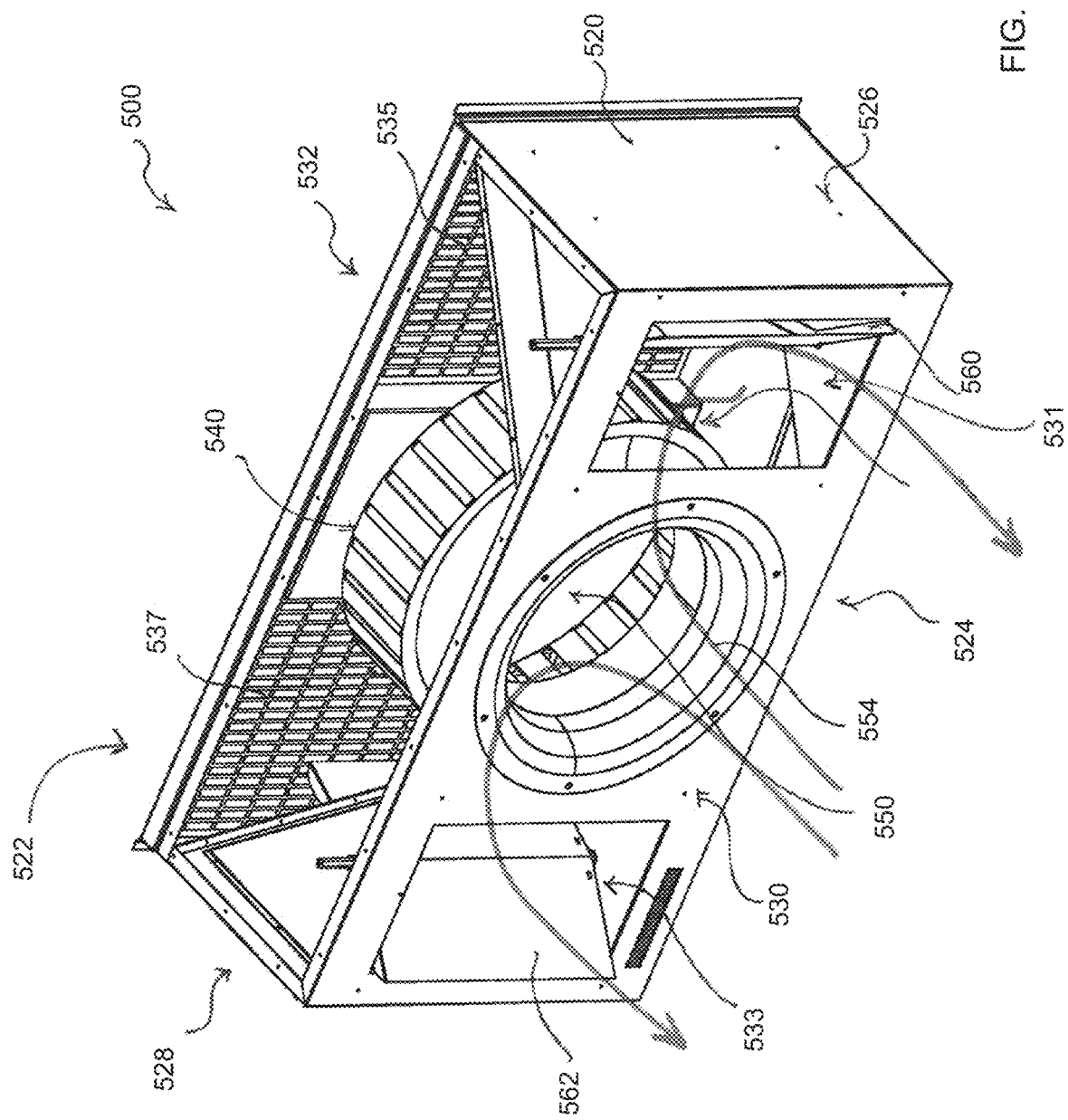
FIG. 14 is a rear perspective view of the fan cassette of FIG. 13, showing the fan, the dampers positioned in a first/rearward orientation and the two rear side openings.
Figure 15:
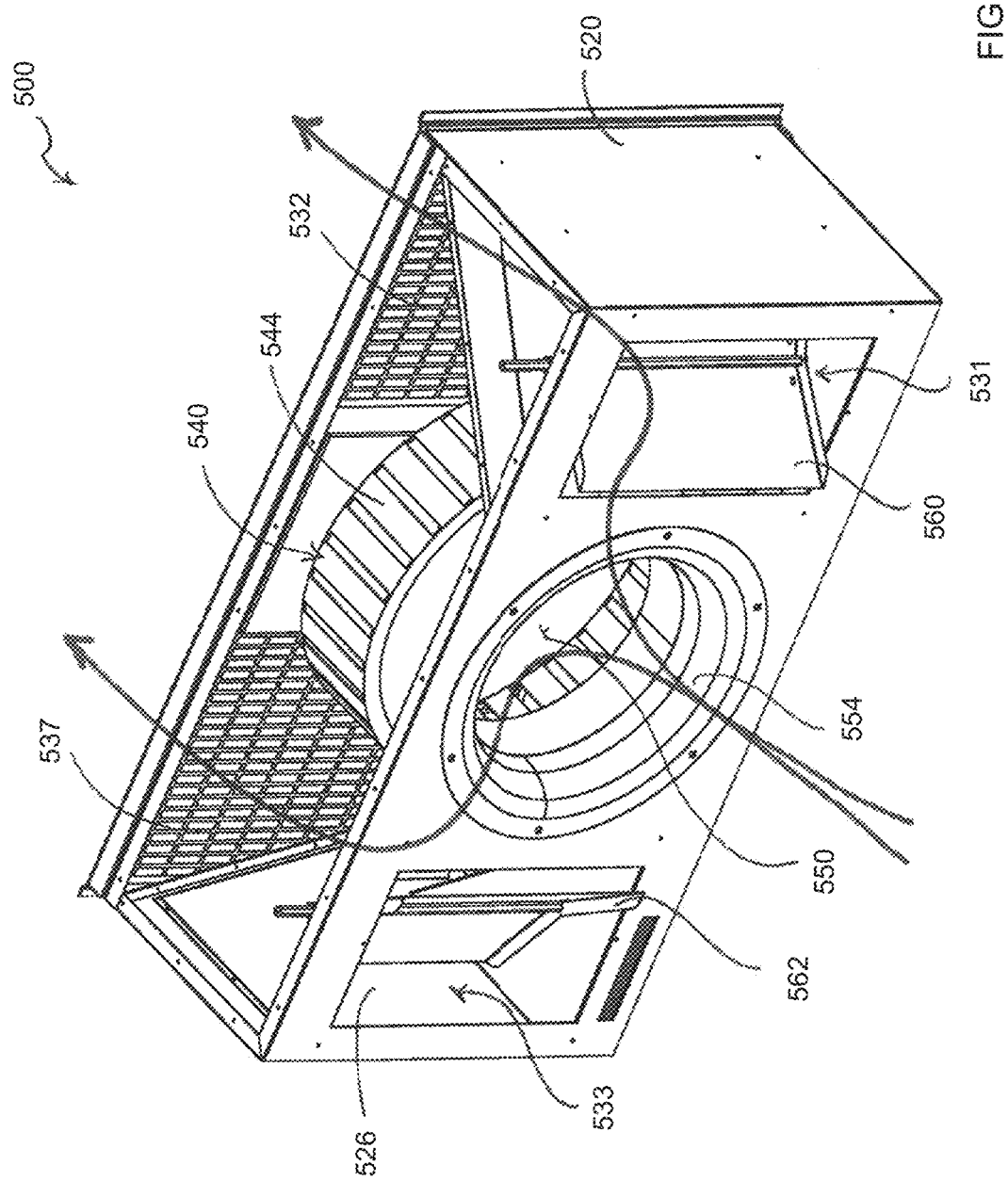
FIG. 15 is another rear perspective view of the fan cassette of FIG. 13, with the dampers positioned in a second/frontward orientation.
Figure 16:
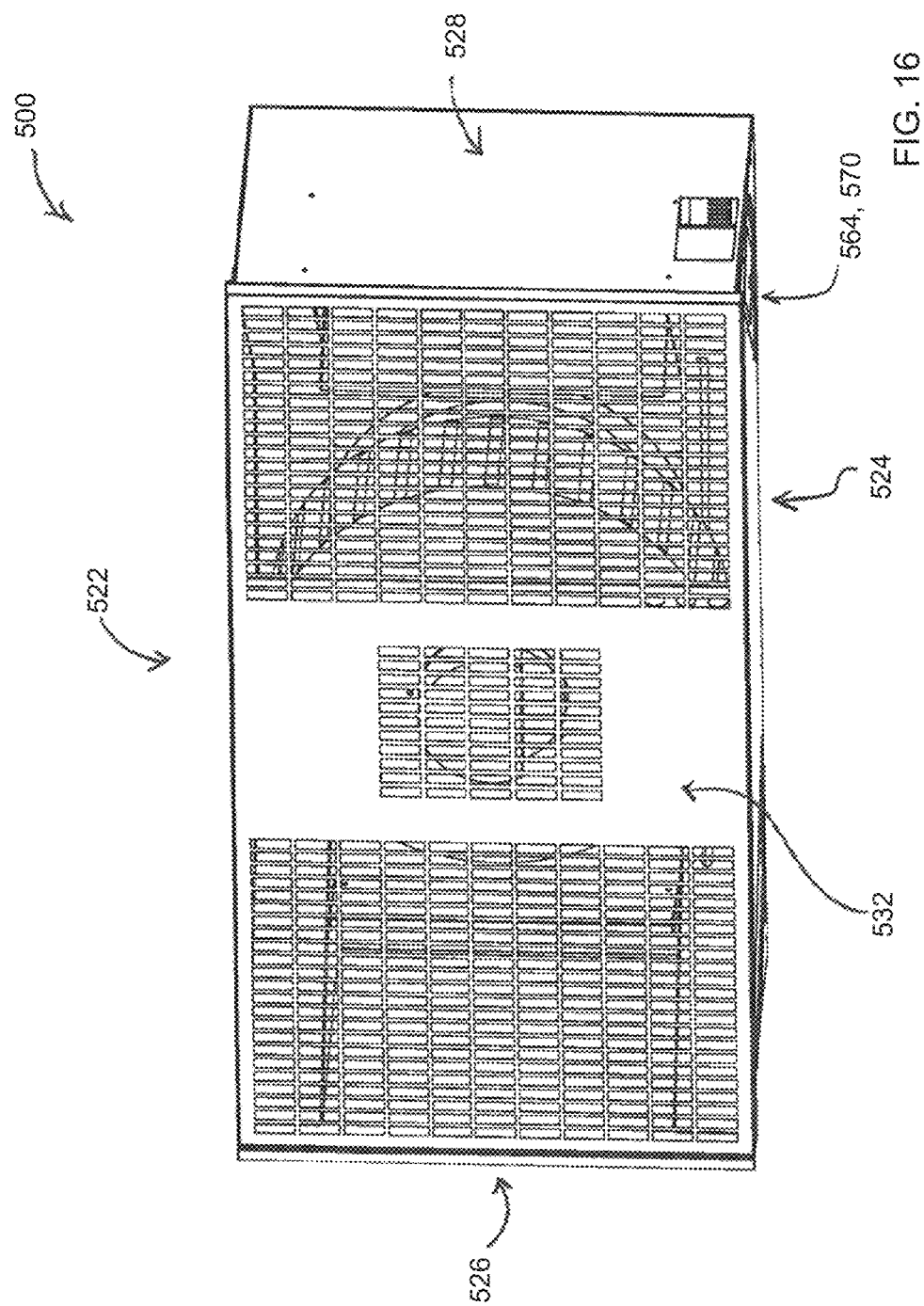
FIG. 16 is a front perspective view of the fan cassette, on which the damper actuator and the fan cassette controller can be seen, on the bottom side of the fan cassette.

Referring now to FIGS. 13 to 18, a possible embodiment of a fan cassette 500 is shown. The fan cassette 500 is an assembly of several components, including the outer casing or cassette 520, the fan 540 and the controller 570 (visible on FIGS. 17 and 18.) Preferably, the fan cassette 500 also includes one or more dampers 560, 562. The fan cassette 500 is designed as a "negative pressure box" that can contribute, when in operation in a modular computing device and rack enclosure 20, such as shown in FIG. 19, to effectively control and maintain a negative air pressure inside the enclosure. The configuration of the fan cassette 500 ensures that it creates therein a negative pressure environment, preventing hot air to return toward to the servers, when the louvers are oriented as shown in FIG. 15.

Referring to FIGS. 13 to 18, the cassette 520, which can also be referred to as a casing, a container or a box, is the structure which supports and protects the fan, the dedicated controller 570, and optionally the dampers 560, 562. The cassette 520 has a top side 522, a bottom side 524, two lateral sides 526, 528, and a rear side 530, near the fan inlet, and a front side 532. As illustrated in the exemplary embodiment of FIGS. 19 and 20, when in operation, one or more fan cassettes 500a-500d will typically be located at the back of a server rack 32, loaded with computing devices 10, such as storing servers, high-speed computing servers, or data miners, whose processors generate a lot of heat.

Referring back to FIGS. 13 to 18, and also to FIGS. 19 and 20, the rear side 530 of the cassette 520 thus will typically face the computing devices, while the front side 532 of the cassette 520 is exposed and accessible for maintenance. Depending on the temperature of the computing devices' surroundings, i.e. outside temperature, the heated air exiting the processing devices 10 must either be redirected back to the computing devices 10, as indicated by arrow A (when the surroundings' temperature is cold) or away therefrom, as indicated by arrow B (when the surroundings' temperature is hot). When hot air must be expelled away from the computing devices, it will go out through openings 535 and 537 of the front side 532 of the fan cassettes.

Referring to FIGS. 13 to 17, the front side 532 of the cassette is preferably provided with a grid 534, with the two air outlets or openings 535, 537 being located on each side of the fan 540. The fan cassette 500 is designed and configured to have its front side 532 face the exterior directly, without needing to be protected by additional enclosures or walls. The rear side 530 (or "fan inlet side", or "computing devices facing side") is also provided with two air outlets openings 531, 533 (best shown in FIGS. 14 and 15), to allow air drawn by the fan to be redirected toward the computing devices, depending on the measured outside temperature, as will be explained in greater detail below.

Still referring to FIGS. 13 to 18, the fan 540 is preferably mounted centrally within the cassette 520. The fan includes a fan inlet 550, a cone or funnel 554, a stator 544, such as fan housing affixed to the cassette, a rotor 542 provided with blades 546, such as an impeller, and fan motor (not illustrated in the figures), to rotate the rotor and blades relative to the stator 544. The fan will typically be an Electronically Commutated (EC) fan, but other types of fans can be used, including any type of axial-flow fans and centrifugal fans. With EC-fans, the motor is formed by magnets and/or coils in the fan's hub. In the illustrated embodiment, air would be drawn through the fan inlet, and funneled towards the blades by the inlet cone 554. The flow of air that is expelled on each side of the fan will hit the dampers 560, 562, and be directed toward the front side (as in FIG. 15) or rear side (as in FIG. 17) of the fan cassette 500, depending on their orientations. As mentioned previously, the dampers 560, 562 are optional, since in some geographical regions, the outside temperature is tempered, and the air heated by the processing devices will always need to be expelled away from the computing devices, through the front side of the fan cassette. In this case, a fixed deflecting plate may be used to direct air outside of the fan cassette.

Figure 17:
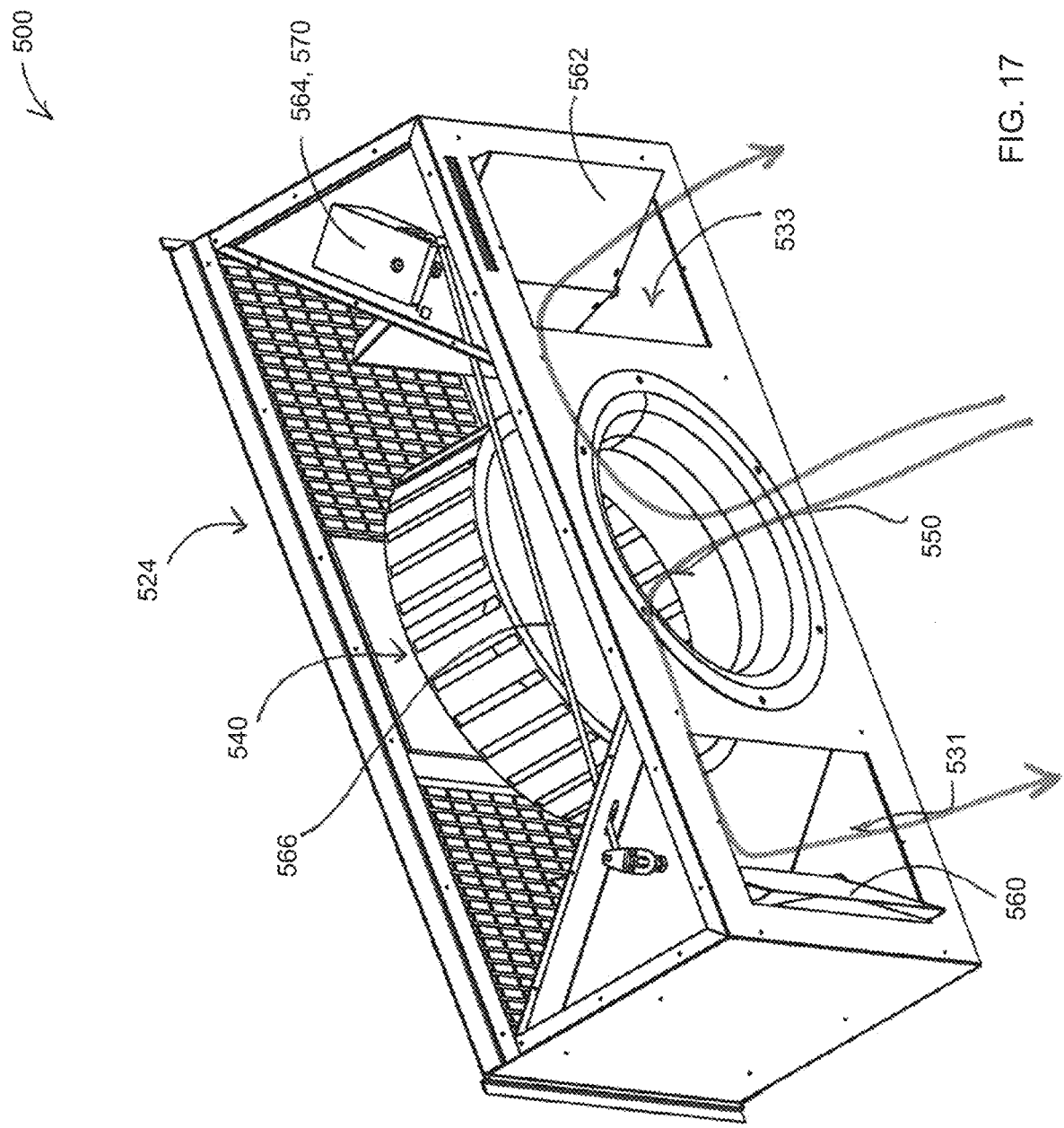
FIG. 17 is a bottom perspective view, with the bottom panel removed, showing the arm or link connecting the two dampers, and showing the controller and damper actuator.

As best shown in FIGS. 17 and 18, the fan cassette 500 comprises a controller 570 (which can be referred to as a "fan cassette controller"), such as a microcontroller, dedicated to the fan cassette. In the exemplary embodiment illustrated, the controller 570 and damper actuator 564 are combined in a single casing, but other configurations are possible, where the controller is apart and distinct from the damper actuator. The controller 570 is operatively connected to the fan motor (now shown) and is configured to control the rotational speed of the fan motor based on an indication or information indicative of the power consumption (in kW) of the one or more computing devices, which in this embodiment would be part of the same server and fan enclosure 20. This power consumption indication is received on a communication port 576, which is typically mounted on the controller 570. The controller 570 includes a processor (CPU), for processing date, and memory means that stores instructions (i.e. algorithms) to adjust the rotational speed of the fan 540, as a function of the power consumption of the computing devices. The controller 570 also includes communication ports (including port 576) and a control ports to control the fan motor. The controller is thus configured to start, increase, maintain, decrease, or stop rotation of the fan motor based on readings or calculations of the power consumed. Typically, the more power consumed, the faster the fan will rotate, but the rotational speed of the fan motor can also be adjusted based on the temperature measured by temperature sensors, which may be located near the fan inlet and/or at the front of the computing devices. The fan cassette 500 is thus an "intelligent" fan cassette, since control instructions are all sent from the fan cassette itself, rather than from an external control system. The fan cassette bases its control on information read of the communication bus, but all controlling instructions are provided by the cassette controller 570. In the event that communication with other sensors and/or cassettes is interrupted, the fan cassette can still operate, since it comprises a temperature sensor (the "back temp" sensor 334 on FIG. 22) on the controller 570, allowing it to control the fan nonetheless. For example, the fan cassette controller 570 can be programmed to maintain the temperature of the back temp sensor of 42 degrees Celsius—by adjusting the fan speed accordingly—as long as the temperature read on the sensor has not reach 52 degrees Celsius.

In data center applications, it is typical to adjust the rotational speed of the fans based on ambient temperature. However, any adjustment is made in reaction to a situation which is already suboptimal, since it is only when the temperature has increased to a given degree, that it has been detected by the sensor, and that a controller has determined that a threshold has been met, that ventilation conditions are adjusted. The proposed fan cassette 500, with its integrated controller 570, acts proactively, since control of rotational speed is made based on the power consumed by the computing devices 10, which may eventually be translated, with a delay, by a temperature increase or decrease, due to the heat generated by the processors of the computing devices. Thus, instead of solely controlling the fan based on environmental conditions detected (such as pressure, temperature or humidity), the information used to control the fan is taken at the heat generation source, i.e. based on the current and voltage drawn by the computing devices, and from which the power consumption can be calculated. In some embodiments, the power (in kW) can be read directly and used by an algorithm to determine the rotational speed of the fan motor. The power consumption (in kW) can be transformed in BTU (British Thermal Unit) or Joules, a measure of heat, and thus by adjusting the speed of the fan as a function of the power, the fan is proactively ventilating the surrounding of the computer devices. In possible implementations, the power consumption can be derived from measurements taken from a power meter installed on the electrical panel 600 of the enclosure, but preferably, the power consumption is derived directly from current and voltage measurement on the main line powering the computing devices.

Control of the fan's speed is thus performed proactively, prior to detecting the eventual temperature change that results from power consumption variations. The proposed configuration of the fan cassette allows anticipating the heat that will be generated by the processors of the computing devices, using the power consumption calculated from power, or current and voltage measures. Given that the outside or surrounding temperature may also vary over a given time period, control of the fan is also preferably based on both the temperatures sensed (at the front and/or back of the computing devices) and the power consumed by the computing devices.

Referring to FIGS. 14 and 15, the fan cassette 500 of the illustrated embodiment includes two dampers 560, 562, positioned on each side of the fan 540. The dampers are shaped and configured as plates angled one relative to the other, having a wide-open V-shape, and affixed to the cassette via a pivot bar extending along the apex of the V-shaped plate. Of course, other damper configurations are possible, as long as they are configured to substantially block the front or rear end openings (535, 537 or 531, 533), depending on their orientation. While the illustrated embodiment is provided with two dampers, it may be possible to achieve the same result with a single damper or with additional dampers, for other fan cassette configurations. As best shown in FIG. 18 (showing the underside of the fan cassette), the two dampers 560, 562 are connected via an arm or link 565, such that the damper actuator 564 only actuates one of the dampers 562, while the other damper 560 follows. The damper actuator 564 thus actuates both dampers simultaneously, while only driving one of the dampers.

In FIG. 15, the dampers 560, 562 are positioned or oriented such that they obstruct the rear openings 531, 533, which causes air expelled by the fan to be forced outside the fan cassette, through the front openings 535, 537 of the front side 532. The fan controller will typically actuate the dampers in this "frontward" or "exterior" configuration when the temperature near the one or more computing devices is above a predetermined threshold. As best shown through opening 533 in FIG. 15, one lateral side of damper 562 abuts the lateral wall 526 of the cassette 520, while the opposite lateral side abuts the inner side of opening 533, thus effectively blocking air from exiting through opening 533. As an example only, the controller 570 can be programmed such that when it reads, via the communication port 576, that the outside temperature is above 20 degrees Celsius, the dampers are to be actuated in the frontward configuration, such the hot air generated by the computing devices is drawn outside the server rack, toward the exterior, as shown by the two arrows.

In FIG. 14, the dampers 560, 562 have been turned and are oriented such that air expelled by the fan is redirected toward the rear side 530 of the fan cassette 520, so as to exit through openings 531, 533. This "rearward" or "computing device facing" configuration is used when the outside or ambient temperature read is below a given threshold, for example, below 5 degrees Celsius, such that air heated by the computing devices is mixed with fresh/cold air intake, to maintain the computing devices within their range of operational temperature.

It is also possible to configure the controller 570 such that it controls the orientation of the dampers over a discrete or continuous range of intermediate damper positions, such that orientation of the dampers is gradually varied as the temperature sensed varies over time.

Figure 21:
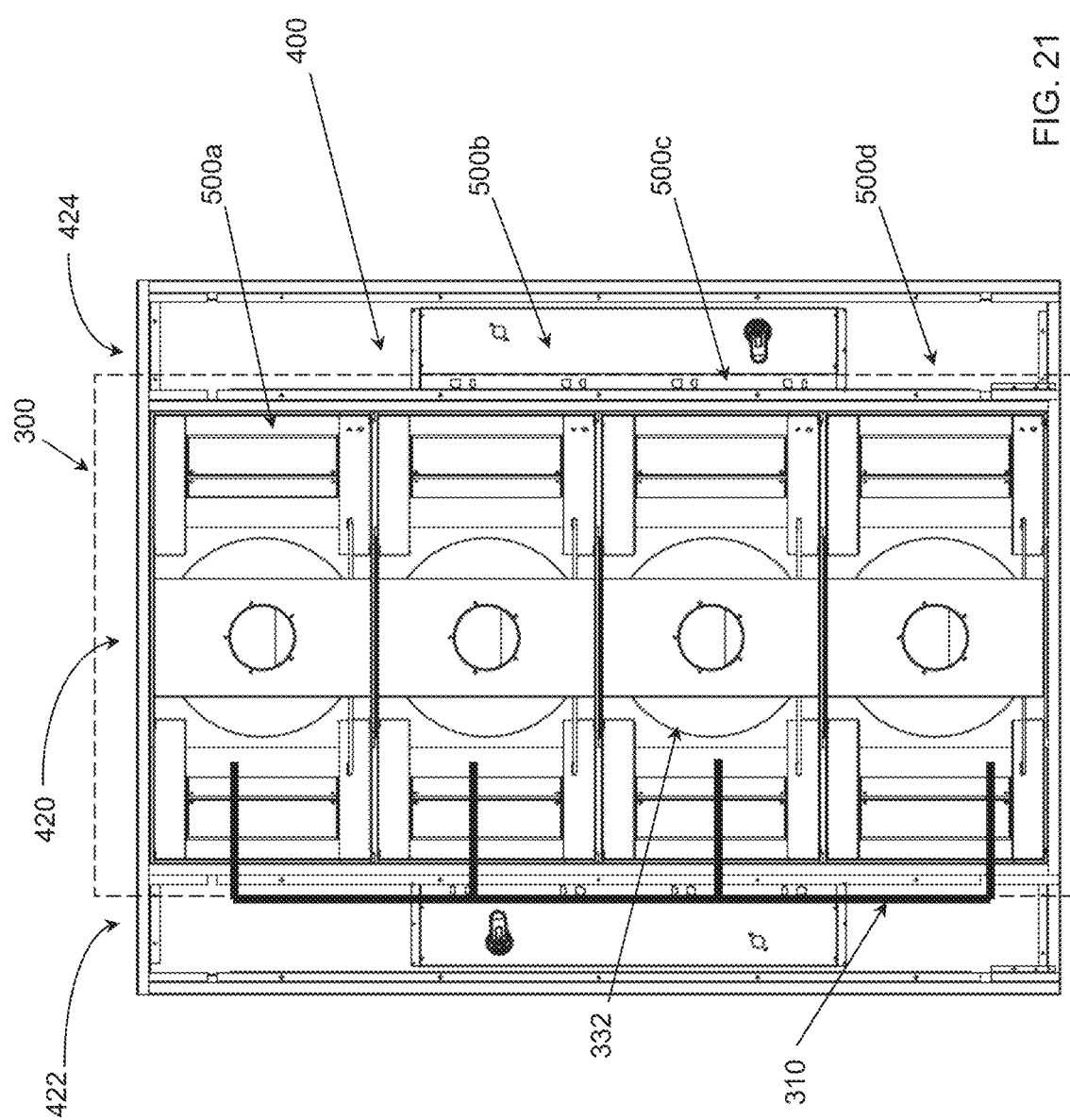
FIG. 21 is a front view of the fan/exterior side of a fan cluster rack, according to a possible embodiment.
Figure 22:
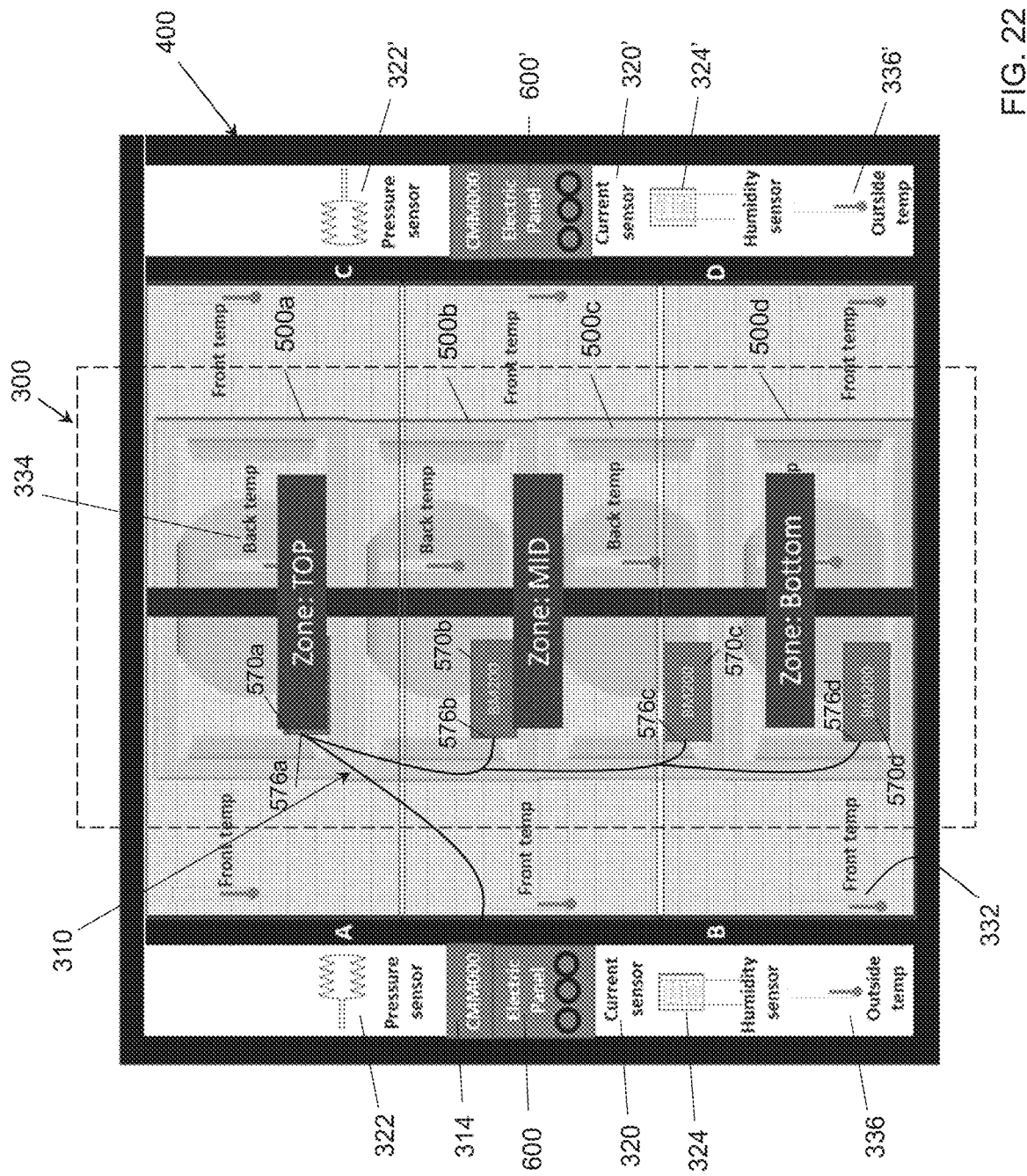
FIG. 22 is a schematic diagram of the fan and rear or exterior side of the fan cluster rack, showing the top, middle and bottom zones, the cluster of fan cassettes, and controllers and sensors, according to a possible embodiment.

Referring now to FIGS. 21 and 22, a fan cassette cluster 300 is shown. The illustrated cluster 300 comprises four fan cassettes 500a-500d, but a minimum of three is required to achieve a redundant N+1 configuration, where each fan cassette has the other fan cassettes act as fan cassette backups. In other implementation, a different number of fan cassettes can be used. The N+1 redundancy cluster is preferably an active-active cluster, where each fan cassette of the cluster remains active and participates to the ventilation process, providing higher availability, and be fault tolerant and more efficient that an active-passive cluster.

If Pt is the total evacuation power needed, and Pn is the evacuation power per cassette, and N is the number of cassettes, then Pn is given by Pn=Pt/N−1 and Pt is given by Pt=(N−1)*Pn Thus, in a cluster of four cassettes, the second, third and fourth cassettes are hot backup of the first cassette; the first, third and fourth cassettes are hot backup of the second cassette; the first, second and fourth cassettes are hot backup of the third cassette; and the first, second and third cassettes are hot backup of the fourth cassette. In this example, each cassette is configured to handle one third the total evacuation power Pt required, or in other words, is sized and configured to handle 1.33 of the power needed compared to a non-redundant configuration. Similarly, in a cluster comprising three cassettes, the second and third cassettes are hot backup of the first cassette, the first and third cassette are hot backup of the second cassette and the first and second cassettes are hot backup of the third cassette, where each cassette is configured to handle half of the total evacuation power Pt required, or in other words, is sized and configured to handle 1.5 of the power needed compared to a non-redundant configuration.

A communication bus, schematically illustrated by reference numeral 310 on FIG. 22, operatively connects the respective communication ports 576a-576d of each fan cassette 500a-500d. The communication bus 310 can thus communicate relevant information to the controllers 570a-570d of each fan cassette, including the indication indicative of the power consumed by the computing devices, derived from the current and voltage measurements taken via the electrical panel 600, for the control of the rotational speed of the fans. The communication bus 310 can also relay the operational status of each fan, such as active or inactive/in fault, so that the controller of each fan cassette of the cluster is aware of the status of the other fan cassette of the cluster, allowing the controllers to adjust speed of their corresponding fan accordingly. The fan controller is programmed to adjust the rotational speed of the fan it controls based on the number of active fans it detects in the fan cluster. A possible option for the communication protocol used for the communication bus 310 is the BACnet protocol, which is a protocol for Building Automation and Control (BAC) networks, but other protocols can be used, such as LonWorks or Modbus, as examples only.

The controller 570a-570d of any given one of the at least three fan cassettes is configured to operate independently, when no other fan cassette is detected or when the operational statuses of adjacent fan cassette are inactive, and to operate in conjunction with the other fan cassettes of the cluster, when the operational statuses of adjacent fan cassettes are active. In other words, control of the fan motor of each cassette is controlled and adjusted by its own dedicated controller: 1) based on the power consumed by the computing devices it is associated with, 2) based on the temperature sensed, either the outside temperature and/or the temperature at the front or back of the computed devices, and 3) based on the operational statuses of the other fan cassettes part of the same cluster.

Still referring to FIGS. 21 and 22, the fan cassette cluster 300 illustrated includes a first fan cassette 500a, a second fan cassette 500b, a third fan cassette 500d and a fourth fan cassette 500d, vertically stacked. In this embodiment, the first fan cassette 500a is a hot backup of the second fan cassette 500b, the second fan cassette 500b is a hot backup of the first and third fan cassettes (500a, 500c), the third fan cassette 500c is a hot backup of the second and fourth fan cassettes (500b, 500d); and the fourth fan cassette (500d) is a hot backup to the third fan cassette (500c).

Figure 23:
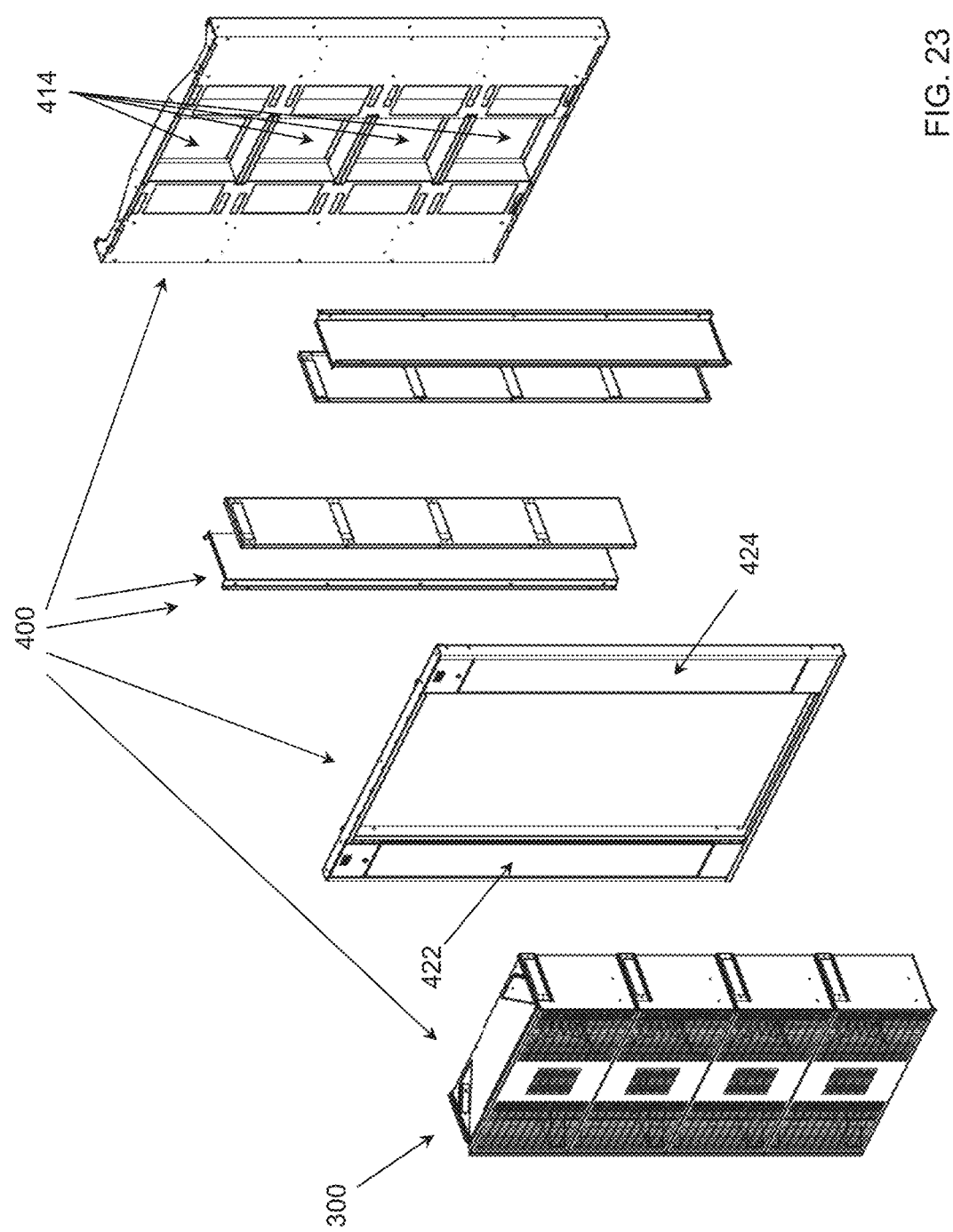
FIG. 23 is an exploded view of the fan cluster rack, with a cluster of four vertically stacked fan cassettes.
Figure 24:
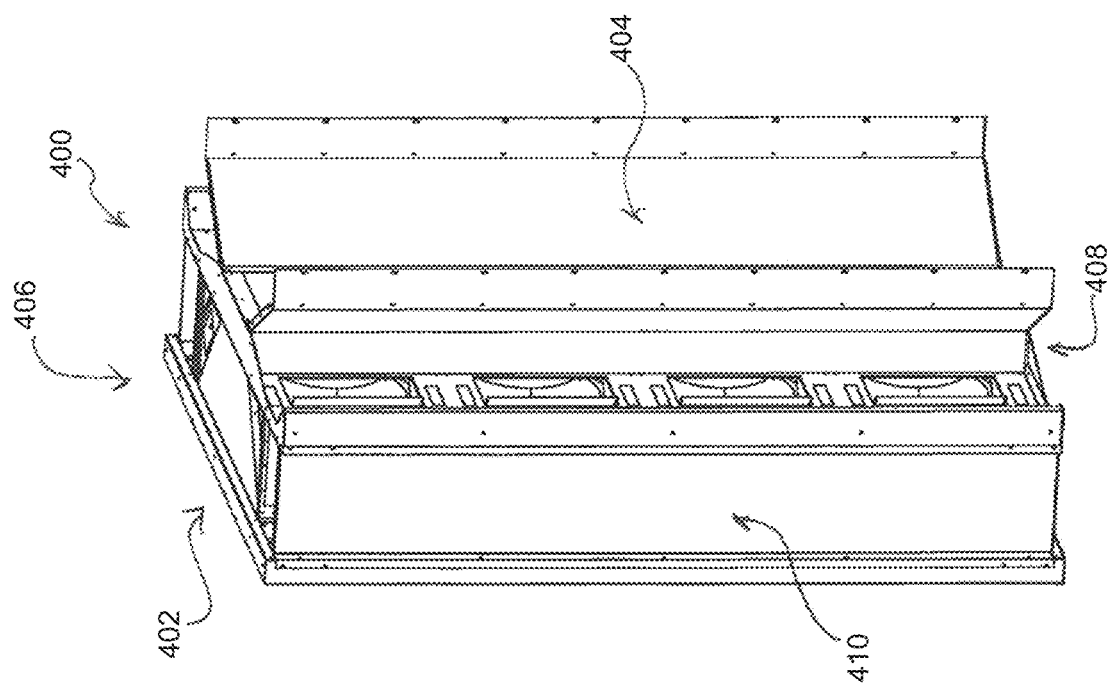
FIG. 24 is perspective view of the fan cluster rack, showing the rear/computing device side.
Figure 25:
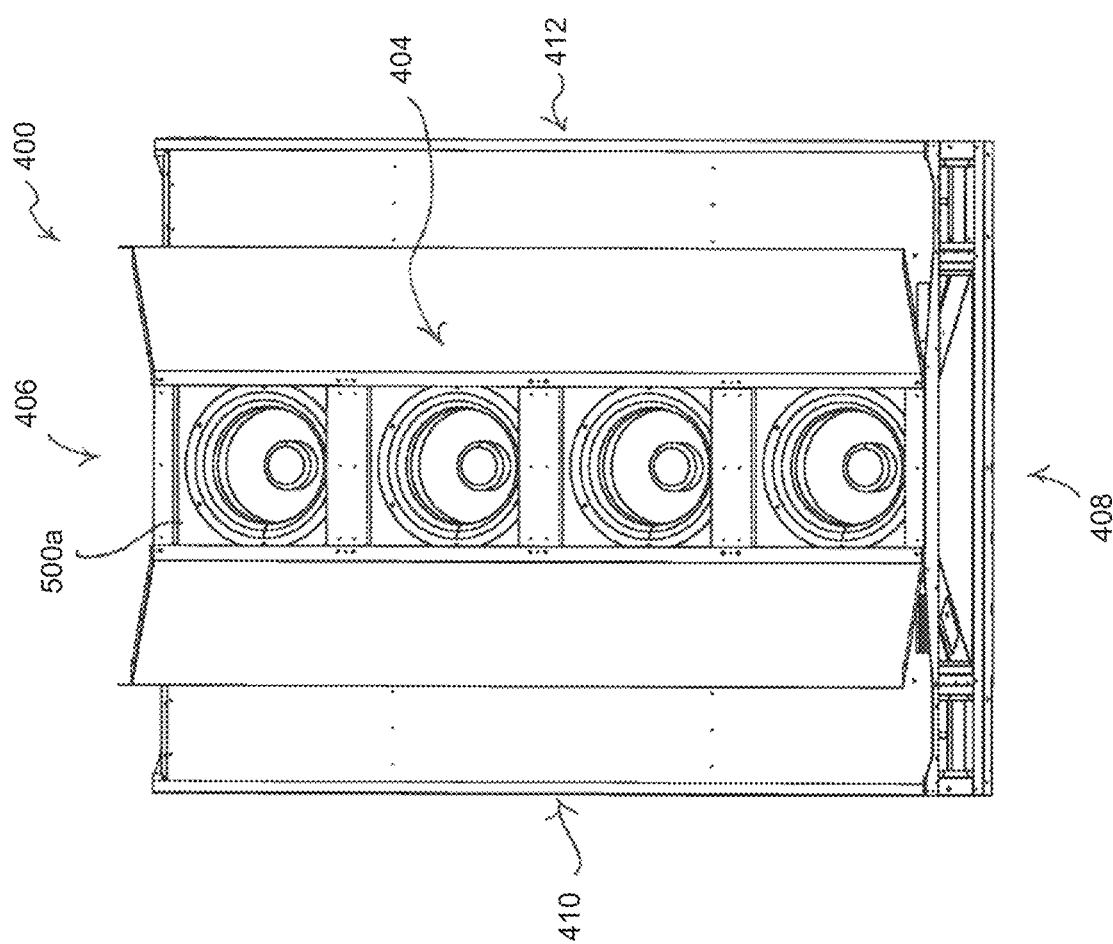
FIG. 25 is another perspective view of the fan cluster rack, showing the rear/computing device side of the rack according to another viewpoint.

Still referring to FIGS. 21 and 22, but also to FIGS. 23 to 25, a possible embodiment of a rack assembly 400 for a fan cassette cluster 300 is illustrated. The rack assembly 400 is comprised of framing elements and panels, and comprises a exterior facing side 402, which is designed to face toward the exterior (or toward a cold zone); a computing device facing side 404, for facing toward the one or more computing devices (or toward a hot zone), a top rack side 406, a bottom rack side 408; and two lateral rack sides 410, 412. On the computing device facing side, two longitudinal plates positioned at angle on each side of the fan inlets funnel air heated by the computing devices, toward the inlets of the fan cassettes.

In the exemplary embodiment, the exterior facing side 402 comprises four fan cassette receiving slots 414 (identified on FIG. 23), for receiving the respective fan cassettes therein. Of course, in other configurations, the number of slots corresponds to the number of fan cassettes of the cluster and may be different than the four slots of the example. As schematically illustrated in FIGS. 21 and 22, the communication bus 310 runs within the rack, vertically along the fan cassette rack and connects to each of the communication ports 576a-576d of the controllers 570a-570d.

Referring to FIGS. 21 and 23, the rack comprises two vertically extending lateral sections 422, 424 on each side of the central section 420 wherein the fan cluster is housed. A single lateral section 422 or 424 could be used, as what is needed is an access to the electrical panel 600 powering the fan cluster 300, and to the different environmental sensors 322, 324, 332, 334, 336 which can be connected to the cluster 300, via the bus 310, to provide additional data which can be used by the controller 570 or by a remote computer (not shown) connected to the fan cluster, for monitoring purposes. The additional sensors can include a pressure sensor 322; one or more front temperature sensors 332 (such as located in front of the computing devices) and/or back temperature sensors 334 (such as located near the fan inlets, at the back of the computing devices), a humidity sensor 324, and the current and voltage sensors 320 for determining a power consumption of the one or more computing devices. The controller 570 of each fan cassette of the cluster 300 can be operatively connected to the different sensors via the communication bus, so as to send alerts to remote computers or devices, and/or to adjust speed of the fan further based on readings of the one or more sensors.

In the illustrated embodiment, the fan cluster and rack are further provided with a sensor controller 314 (also referred to as a data acquisition and control adapter), operatively connected to the one or more environmental condition sensors. For the front temperature sensors, an average temperature at the front of the rack can be calculated by controller 314 based on the temperature readings of all three sensors. Alternately, the average temperature can be calculated by the controllers 570. The sensor controller 314 is in communication with each controller 570a-570d of the respective fan cassettes to relay readings of the sensors via the communication bus 310. In yet other implementation, the sensor controller 314 can be omitted by integrating its functionalities within the controllers 570a-570d. However, in order to simplify the configuration of the cluster and rack arrangement, the sensor controller 314 is distinct from the fan controllers 570, to provide easy access thereto and to the sensors 322, 324, 300. All control cards and/or adapters can thus publish their information on the communication bus, functionally acting as a "single" controller. The electrical panel 600 is also provided and accessible via the lateral/access section 422.

In the illustrated embodiments, the current sensor 320, pressure sensor 322 and humidity sensor 324 all have corresponding redundant sensors 320', 322', 324'. The same applies to temperature sensors 332 with 322', 324 with 324' and 336 with 336'. The electrical panel and current/voltage sensors can also be redundant, for higher reliability. The sensor controller 314 and/or the fan cassette controllers 570a-570d can calculate average humidity, pressure and temperature values using readings from the sensors of a given type. In the proposed embodiment, two electrical panels (or power sources) are provided, but a single power source could be used (at 120 kW for example). If two power sources are provided, they can work as a 2N redundant configuration or in an extended configuration (where each source would provide 60 kW).

Referring to FIG. 22, the rack can be divided in a top, a middle and a bottom zone, each zone being served by a pair of redundant fan cassettes. The different rack zones are positioned and configured such that at least one fan cassette is at least partially aligned therewith: the fan cassette 500d for the bottom zone, fan cassettes 500b and 500c for the middle zone and fan cassette 500a for the top zone. While the embodiment shown includes four fan cassettes, only three are required to cool the enclosure. The fan cassettes and receiving slots are configured such that the cassettes can be easily slid in and out of the rack 400.

As can be appreciated, in contrast with existing multi-fan systems, such as fan arrays or fan walls, that are primarily used as part of large air handling unit systems, the fan cassette cluster described herein above provides higher availability, increased fault tolerance and higher ventilation and energy efficiency.

Higher availability is achieved by providing each fan cassette with its own independent, dedicated controller. The controller of each cassette can communicate with a minimum of three other fan cassette, in a N+1 redundancy cluster. The controller of each fan cassette executes the programmed instructions and algorithms, to control the fan speed and damper orientation/position, independently from the other fan cassettes. The proposed fan cassette cluster is a fully active/active cluster. There are no master or slave fans or controlling devices. Operational uniformity among the fan cassette is still possible since the four controllers of a cluster use rely of the same sensor readings to control the fan speed and flow of air.

The fan cassette configuration is extremely efficient, given that the controller of each fan cassette adjusts the speed of the fan motor based on the electrical power that is consumed by the compute devices they need to cool down. The fan cassettes are thus pro-active, instead of being reactive, as existing cooling systems which control is based on temperature readings.

Higher fault tolerance is achieved at least in part through the configuration of the computing server rack and of the fan cassette cluster rack, which are directly connected to one another so as to create a zone of low pressure therebetween, and directly at the back of the computer devices, stacked in the computing server rack. The sealed, low-pressure space connecting the computing devices and fan racks is only a few inches wide. As such, only three fan cassettes are needed to cool the top, middle and bottom zones, but 4 fans preferably run continuously at reduced speed to ensure ultra-fast fail over recovery.

It will be appreciated from the foregoing disclosure that there is provided a modular enclosure, which can, by virtue of its design, form a secure structure either alone or when connected to other modular enclosures. The enclosure is adapted to be installed as an independent structure, as collocation (e.g., with other enclosures or a separate building), at an edge site or hyperscale data center. The enclosure can be constructed entirely out of lightweight metal, such as steel bonded with urethane, for example, and ensures that the electronic equipment stored therein is protected from vandalism and environmental damage when installed outdoors.

The enclosure can be pre-fabricated off-site, loaded with computing devices/electronics, and shipped to the installation site. Alternatively, the separate components of the enclosure can be pre-fabricated and shipped to the installation site, and the enclosure can be assembled on-site and loaded with computing devices. As such, the modular pre-fabrication of the enclosures, or components thereof, can reduce the costs related to building, installation and shipping, while also reducing site disturbance for substantially the entire life of the created data center. In alternative embodiments, the base module and housing module are formed as a one-piece unit which can be shipped to the desired location and mounted on the support assembly on site.

Of course, numerous modifications could be made to the embodiments described above without departing from the scope of the present disclosure.

The invention claimed is:

1. A modular enclosure, comprising:
   a housing module having two lateral sides, a rear side, a front side, and a roof, together defining an interior volume for housing computing devices and one or more fan cassettes;
   a communication bus for relaying an indication of the power consumption of the computing devices;
   at least one temperature sensor for sensing a temperature near the computing devices;
   said one or more fan cassettes each comprising:
      a fan comprising a fan inlet for pulling ambient air therein; and a fan outlet for pushing conditioned air thereout; a stator; and a rotor provided with blades for drawing the ambient air from the fan inlet to the fan outlet, and a fan motor for rotating the rotor relative to the stator;
      at least one damper provided in the cassette, for directing a flow of air output by the fan toward the rear side or the front side of the housing module;
      a damper actuator, for changing an orientation of the at least one damper;
      a controller operatively connected to the fan motor and to the communication bus, the controller being configured to increase or decrease a rotational speed of the fan motor on the basis of the power consumption of the computing devices received via the communication bus and based on the temperature sensed by the at least one temperature sensor;
      the controller being operatively connected to the temperature sensor and to the damper actuator, for controlling the damper actuator to change the orientation of the at least one damper based on the temperature sensed near the computing devices;
      a power supply for powering the fan motor and the controller; and
      a cassette for housing the fan, the power supply and the controller; and
   wherein controlling operation of the fan motor based on the power consumption of the computing devices provides near real-time control on a temperature inside the housing module.

2. The modular enclosure according to claim 1, wherein for each of the one or more fan cassette, the controller is configured to control the damper actuator to position the at least one damper to redirect the air outputted by the fan toward the rear side of the housing module, outside of the housing module, when the temperature sensed near the one or more computing devices is above a predetermined threshold; and to redirect air outputted by the fan toward the front side of the housing module, back to the computing devices, when the temperature is below a predetermined threshold.

3. The modular enclosure according to claim 1, comprising at least three of said fan cassettes, the at least three fan cassettes forming a fan cassette cluster, wherein:
   the communication bus is operatively connected to respective communication ports of the respective fan cassettes, for communicating thereto the indication of the power consumption of the computing devices; and for communicating thereto an indication of an operational status of the respective fan cassettes of the cluster,
   the controller of each of the fan cassettes is configured to adjust the rotational speed of the rotor further based on the operational status of adjacent ones of the fan cassettes.

4. The modular enclosure according to claim 3, wherein the controller of any given one of the at least three fan cassettes is configured to operate independently, when no other fan cassette is detected or when the operational statuses of adjacent fan cassette is detected as inactive, and to operate in conjunction with the other fan cassettes of the cluster, when the operational statuses of adjacent ones of the fan cassettes is detected as active.

5. The modular enclosure according to claim 3, wherein the cluster of fan cassette is configured as a N+1 redundancy cluster, where each fan cassette has one of the adjacent ones of the fan cassettes act has as a fan cassette backup.

6. The modular enclosure according to claim 5, wherein the N+1 redundancy cluster is an active-active cluster.

7. The modular enclosure according to claim 1, comprising:
an electrical panel;
and one or more condition sensors including at least one of a pressure sensor; additional temperature sensors; a humidity sensor, and current and voltage sensors for determining the power consumption of the computing devices; and
wherein the controller of each fan cassette is operatively connected to the one or more condition sensors via the communication bus and is configured to adjust the rotational speed of the corresponding fan of the fan cassette further based on readings of the one or more condition sensors.

8. The modular enclosure according to claim 7, further comprising:
a sensor controller operatively connected to the one or more condition sensors, the sensor controller being in communication with each controller of the respective fan cassettes to relay readings of the sensors via the communication bus.

9. The modular enclosure according to claim 1, further comprising a platform, the platform and roof being shaped and configured for connecting to similar adjacent modular enclosures so as to form a data center structure, in at least one of a side-to-side and front-to-front configuration.

10. The modular enclosure according to claim 9, wherein:
the roof comprises a forward section overhanging on the front side of the housing module,
the platform comprises a front section extending frontward of the housing module on the front end thereof, and
the forward section of the roof and the front section of the platform being configured for connecting to a forward section and a front section of a similar adjacent modular enclosure.

11. The modular enclosure according to claim 10, wherein the platform comprises a rear section extending rearward of the housing module, the rear section being configured for connecting to a rear section of a similar adjacent module in a back-to-back configuration.

12. The modular enclosure according to claim 11, further comprising a support assembly connected to the platform, for positioning the platform in an elevated state relative to the ground.

13. The modular enclosure according to claim 1, wherein the housing module comprises a computing device rack assembly, positioned within the housing module toward the front side, for receiving the computing devices, and a fan cassette rack assembly, positioned within the housing module toward the rear side, the computing device rack assembly and the fan cassette rack assembly being positioned back to back within the housing module.

14. The modular enclosure according to claim 13, comprising at least one plenum section provided with a plenum inlet, said at least one plenum section extending vertically on one of the lateral sides of the housing module, such that surrounding air enters the interior volume from below the housing module though the plenum inlet and travels upwardly within the at least one plenum section, is pulled though the computing device rack assembly toward the rear side of the housing module by the one or more fan cassette.

15. The modular enclosure according to claim 14, comprising at least one air filter extending vertically within the housing module, along the at least one plenum section, the surrounding air sucked through the plenum inlet passing through the filter when travelling from the at least one plenum section to the front side of the housing module and toward the rear side of the housing module.

16. The modular enclosure according to claim 15, wherein the front side of the housing module is provided with a door to allow access to the interior volume, and wherein the at least one air filter comprises two air filters provided on either sides of the door.

\* \* \* \* \*

UNITED STATES PATENT AND TRADEMARK OFFICE
CERTIFICATE OF CORRECTION

PATENT NO. : 11,503,737 B2
APPLICATION NO. : 17/217569
DATED : November 15, 2022
INVENTOR(S) : Alain Goudreault and Claude Goudreault It is certified that error appears in the above-identified patent and that said Letters Patent is hereby corrected as shown below:

On the Title Page

Item (63) in the "Related U.S. Application Data" section:
Remove that the application is a continuation of application No. 63/004,605, filed on April 3, 2020.

Item (60) should be replaced as follows:
"Provisional application No. 63/004,630, filed on Apr. 3, 2020, provisional application No. 63/004,605, filed on Apr. 3, 2020."

Signed and Sealed this
Fourteenth Day of March, 2023

Katherine Kelly Vidal
*Director of the United States Patent and Trademark Office*